(12) United States Patent
Gu et al.

(10) Patent No.: US 11,773,480 B2
(45) Date of Patent: Oct. 3, 2023

(54) MXENE LAYERS AS SUBSTRATES FOR GROWTH OF HIGHLY ORIENTED PEROVSKITE THIN FILMS

(71) Applicant: Drexel University, Philadelphia, PA (US)

(72) Inventors: Zongquan Gu, Chalfont, PA (US); Babak Anasori, Fisher, IN (US); Andrew Lewis Bennett-Jackson, Montclair, NJ (US); Matthias Falmbigl, Philadelphia, PA (US); Dominic Imbrenda, Deptford, NJ (US); Yury Gogotsi, Warminster, PA (US); Jonathan E. Spanier, Bala Cynwyd, PA (US)

(73) Assignee: Drexel University, Philadelphia, PA (US)

( * ) Notice: Subject to any disclaimer, the term of this patent is extended or adjusted under 35 U.S.C. 154(b) by 1 day.

(21) Appl. No.: 16/756,337

(22) PCT Filed: Oct. 9, 2018

(86) PCT No.: PCT/US2018/054955
§ 371 (c)(1),
(2) Date: Apr. 15, 2020

(87) PCT Pub. No.: WO2019/079062
PCT Pub. Date: Apr. 25, 2019

(65) Prior Publication Data
US 2020/0240000 A1 Jul. 30, 2020

Related U.S. Application Data

(60) Provisional application No. 62/572,818, filed on Oct. 16, 2017.

(51) Int. Cl.
*C23C 14/58* (2006.01)
*C23C 16/455* (2006.01)
(Continued)

(52) U.S. Cl.
CPC ........ *C23C 14/088* (2013.01); *C04B 35/4682* (2013.01); *C04B 35/4686* (2013.01);
(Continued)

(58) Field of Classification Search
CPC ........ H01G 4/30; H01G 4/005; H01G 4/1209; H01G 4/12; H01G 4/224; H01G 4/232;
(Continued)

(56) References Cited

U.S. PATENT DOCUMENTS 5,717,250 A 2/1998 Schuele et al.
2003/0045006 A1 3/2003 Basceri
(Continued)

FOREIGN PATENT DOCUMENTS

CN 108470835 A 8/2018

OTHER PUBLICATIONS

Ahmed et al., "Atomic Layer Deposition of SnO2 on MXene for Li-Ion Battery Anodes," Nano Energy, 2017, 34, 249-256.
(Continued)

*Primary Examiner* — Humera N. Sheikh
*Assistant Examiner* — Elizabeth D Ivey
(74) *Attorney, Agent, or Firm* — BakerHostetler

(57) ABSTRACT

The present disclosure is directed to using MXene compositions as templates for the deposition of oriented perovskite films, and compositions derived from such methods. Certain specific embodiments include methods preparing an oriented perovskite, perovskite-type, or perovskite-like film, the methods comprising: (a) depositing at least one perovskite, perovskite-type, or perovskite-like composition or precursor composition using chemical vapor deposition
(Continued)

(CVD), physical vapor deposition (PVD), or atomic layer deposition (ALD) onto a film or layer of a MXene composition supported on a substrate to form a layered composition or precursor composition; and either (b) (1) heat treating or annealing the layered precursor composition to form a layered perovskite-type structure comprising at least one oriented perovskite, perovskite-type, or perovskite-like composition; or (2) annealing the layered composition; or (3) both (1) and (2).

8 Claims, 12 Drawing Sheets

(51) Int. Cl.
| | |
|---|---|
| C23C 16/56 | (2006.01) |
| C04B 35/468 | (2006.01) |
| H01L 21/02 | (2006.01) |
| C23C 14/08 | (2006.01) |
| C23C 14/02 | (2006.01) |
| C23C 14/06 | (2006.01) |
| C23C 16/02 | (2006.01) |
| C23C 16/32 | (2006.01) |
| C23C 16/40 | (2006.01) |
| H01L 49/02 | (2006.01) |

(52) U.S. Cl.
CPC ........ *C23C 14/024* (2013.01); *C23C 14/0635* (2013.01); *C23C 14/5806* (2013.01); *C23C 16/0272* (2013.01); *C23C 16/32* (2013.01); *C23C 16/409* (2013.01); *C23C 16/45531* (2013.01); *C23C 16/56* (2013.01); *H01L 21/02197* (2013.01); *H01L 28/55* (2013.01)

(58) Field of Classification Search
CPC ... B32B 18/00; C04B 35/01; C04B 2235/963; C04B 2237/343; C04B 2237/346; C04B 2237/348; C04B 2237/56; C04B 2237/704; H05K 1/0306; H05K 3/4629
See application file for complete search history.

(56) References Cited

U.S. PATENT DOCUMENTS

| | | | |
|---|---|---|---|
| 2006/0071592 | A1 | 4/2006 | Narasimhan et al. |
| 2009/0261352 | A1* | 10/2009 | Chen .................. F21S 9/037 257/E33.001 |
| 2015/0298161 | A1* | 10/2015 | Beeckman .............. C23C 16/44 428/336 |
| 2017/0077402 | A1* | 3/2017 | Oooka ................. H01L 51/0007 |
| 2017/0294546 | A1* | 10/2017 | Ghidiu .................. C01B 32/949 |

OTHER PUBLICATIONS

Alaskar et al., "Towards van Der Waals Epitaxial Growth of GaAs on Si Using a Graphene Buffer Layer," Adv. Funct. Mater., 2014, 24 (42), 6629-6638.
Anasori et al., "2D Metal Carbides and Nitrides (MXenes) for Energy Storage," Nat. Rev. Mater., 2017, 2 (2).
Anasori et al., "Control of Electronic Properties of 2D Carbides (MXenes) by Manipulating Their Transition Metal Layers," Nanoscale Horiz, 2016, 1 (3), 227-234.
Attfield, ""A" Cation Control of Perovskite Properties," Cryst. Eng., 2002, 5 (3-4 SPEC.), 427-438.
Falmbigl et al., "BaTiO3 Thin Films from Atomic Layer Deposition: A Superlattice Approach," J. Phys. Chem. C., 2017.
Hantanasirisakul et al., "Fabrication of Ti 3 C 2 T x MXene Transparent Thin Films with Tunable Optoelectronic Properties," Adv. Electron. Mater., 2016, 2 (6), 1600050.
Hong et al., "Van Der Waals Epitaxy of InAs Nanowires Vertically Aligned on Single-Layer Graphene," Nano Lett., 2012, 12 (3), 10-15.
Hsiu-Fung et al., "Characteristics of BaTiG3 Films Prepared by Pulsed Laser Deposition," Jpn. J. Appl. Phys., 1993, 32, 5656-5660.
Jung et al., Oriented Film Growth of Ba1-xSrxTiO3 Dielectrics on Glass Substrates Using 2D Nanosheet Seed Layer, ACS Appl. Mater. Interfaces, 5, 11, 2013, 4592-4596.
Kim et al., "Atomic Layer Deposition on 2D Materials," Chem. Mater. 2017, 29, 3809-3826.
Kimura et al., "Thermally Stable Dielectric Responses in Uniaxially (001)-Oriented CaBi4Ti4O15 Nanofilms Grown on a Ca2Nb3O10-Nanosheet Seed Layer," Sci. Rep., 2016, 6 (Sep. 2015), 1-9.
Kingon et al., "Alternative Dielectrics to Silicon Dioxide for Memory and Logic Devices," Nature, 2000, 406, 1032-1038.
Kittl et al., "High-K Dielectrics for Future Generation Memory Devices (Invited Paper)," Microelectron. Eng., 2009, 86 (7-9), 1789-1795.
Kobayashi, "X-Ray Thin-Film Measurement Techniques IV. In-Plane XRD Measurements" Rigaku J., 2010, 26 (1), 3-11.
Koma, "Van Der Waals Epitaxy—a New Epitaxial Growth Method for a Highly Lattice-Mismatched System," Thin Solid Films, 1992, 216 (1), 72-76.
Lee et al., "Highly Oriented SrTiO3 Thin Film on Graphene Substrate," ACS Appl. Mater. Interfaces, 2017, 9 (4), 3246-3250.
Lee et al., "Suppressed Dependence of Polarization on Epitaxial Strain in Highly Polar Ferroelectrics," Phys. Rev. Lett., 2007, 98 (21), 98-101.
Mashtalir et al., "Intercalation and Delamination of Layered Carbides and Carbonitrides," Nat. Commun., 2013, 4, 1-7.
Mathews et al., "Ferroelectric Field Effect Transistor Based on Ferroelectric Field Effect Transistor Based on Epitaxial Perovskite Heterostructures," Science (80-.), 1997, 276, 238-240.
Pang et al., "Preparation of Epitaxial Hexagonal YMnO3 Thin Films and Observation of Ferroelectric Vortex Domains," npj Quantum Mater, 2016, 1 (1), 16015.
Pesquera et al., "Surface Symmetry-Breaking and Strain Effects on Orbital Occupancy in Transition Metal Perovskite Epitaxial Films," Nat Commun., 2012, 3, 1-7.
Seidel et al., "Conduction at Domain Walls in Oxide Multiferroics," Nat. Mater., 2009, 8 (3), 229-234.
Seidel et al., "Efficient Photovoltaic Current Generation at Ferroelectric Domain Walls," Phys. Rev. Lett., 2011, 107 (12), 1-4.
Shi et al., "Van Der Waals Epitaxy of MoS2 Layers Using Graphene as Growth Templates," Nano Lett., 2012, 12 (6), 2784-2791.
Shibata et al., "Fabrication of Anatase Thin Film with Perfect C-Axis Orientation on Glass Substrate Promoted by a Two-Dimensional Perovskite Nanosheet Seed Layer," Cryst. Growth Des., 2010, 10 (8), 3787-3793.
Shibata et al., "One-Nanometer-Thick Seed Layer of Unilamellar Nanosheets Promotes Oriented Growth of Oxide Crystal Films," Adv. Mater., 2008, 20 (2), 231-235.
Shibata et al., "Versatile van Der Waals Epitaxy-like Growth of Crystal Films Using Two-Dimensional Nanosheets as a Seed Layer: Orientation Tuning of SrTiO3 Films along Three Important Axes on Glass Substrates," J. Mater. Chem. C., 2014, 2 (3), 441-449.
Silva et al., "Influence of Laser Repetition Rate on Ferroelectric Properties of Pulsed Laser Deposited BaTiO3 Films on Platinized Silicon Substrate," Appl. Phys. A Mater. Sci. Process, 2013, 113 (2), 379-384.
Taylor et al., "Evidence of Domain Wall Contribution to the Dielectric Permittivity in PZT Thin Films at Sub-Switching Fields," J. Appl. Phys., 1997, 82 (4), 1973-1975.
Tokunaga et al., "Composite Domain Walls in a Multiferroic Perovskite Ferrite," Nat. Mater., 2009, 8 (7), 558-562.
Vailionis et al., "Misfit Strain Accommodation in Epitaxial ABO3 Perovskites: Lattice Rotations and Lattice Modulations," Phys. Rev. B—Condens. Matter. Mater. Phys., 2011, 83 (6), 1-10.
Vehkamäki et al., "Atomic Layer Deposition of BaTiO3 Thin Films—Effect of Barium Hydroxide Formation," Chem. Vap. Depos., 2007, 13 (5), 239-246.
Wang et al., "Epitaxial BiFeO3 Mutiferroic Thin Film Heterostructures", Science, 2003, 299 (5613), 1719-1722.

(56) References Cited

OTHER PUBLICATIONS

Wang et al., "Lattice, Elastic, Polarization, and Electrostrictive Properties of BaTiO3from First-Principles," J. Appl. Phys., 2010, 108 (3).
Wang et al., "Oxide Thin-Film Electronics Using All-MXene Electrical Contacts," Adv. Mater., 2018, 1706656, 1-7.
Wu et al., "Properties of Epitaxial SrRuO 3 Thin Films," Appl. Phys. Lett., 1993, 62 (19), 2434-2436.
Xu et al., "Ferroelectric Polarization Reversal via Successive Ferroelastic Transitions," Nat. Mater., 2015, 14 (1), 79-86.
Xu et al., "Stationary Domain Wall Contribution to Enhanced Ferroelectric Susceptibility," Nat. Commun., 2014, 5, 1-7.
Yu et al., "Epitaxial Oxide Thin Films on Si(001)," J. Vac. Sci. Technol. B Microelectron. Nanom. Struct., 2000, 18 (4), 2139.
Zayak et al., "Structural, Electronic, and Magnetic Properties of SrRuO3 under Epitaxial Strain," Phys. Rev. B., 2006, 74 (9), 094104.

\* cited by examiner

MXENE LAYERS AS SUBSTRATES FOR GROWTH OF HIGHLY ORIENTED PEROVSKITE THIN FILMS

CROSS-REFERENCE TO RELATED APPLICATIONS

This application is the National Stage Application of International Patent Application No. PCT/US2018/054955, filed Oct. 9, 2018, which claims priority to U.S. Patent Application No. 62/572,818, filed Oct. 16, 2017, the contents of which foregoing applications are incorporated by reference herein in their entireties for any and all purposes.

TECHNICAL FIELD

The present disclosure relates to the use of MXene materials as templates for deposition (or other introduction) of perovskite oxides and other complex oxide materials on (with) amorphous, semi-crystalline or crystalline physical or virtual substrates.

BACKGROUND

Perovskite oxide thin films offer a wide range of physical properties ranging from piezoelectricity, ferroelectricity, and multiferroicity to superconductivity depending on the chosen cations in $ABO_3$. Thin films of these perovskite oxides allow for controlled manipulation of nanoscale phenomena, such as domain walls, which can enhance polarization and other physical properties. Heteroepitaxial growth of thin film perovskite oxides can provide opportunities to tune these physical properties, but is greatly reliant on the chosen substrate. Recently, orders of magnitude enhancement in dielectric constant has been realized in $PbZr_{0.2}Ti_{0.8}O_3$ ferroelectric thin films grown on (111) $SrTiO_3$ substrates. The high symmetry in (111) orientation leads to a manifold of polarization directions and hence domain wall density. The high domain wall density spurs the extrinsic contribution in dielectric properties and provides alternate switching paths on the potential landscape, saving more energy than direct opposite switching.

While in recent years, the availability of single-crystalline perovskite substrates has allowed for such control of thin films, the lattice mismatch between the film and substrate must be very small to produce coherent and dislocation free films by high temperature deposition techniques such as chemical vapor deposition (CVD), pulsed laser deposition (PLD) and molecular beam epitaxy (MBE) or low temperature deposition methods (e.g., atomic layer deposition, ALD). For most of these applications, a uniform dielectric layer with precisely controlled thickness on top of the 2D-material is paramount. In this regard, the growth of dielectric layers via such methods on 2D-materials faces challenges, including for example, selective oxide deposition at grain boundaries of surfaces, cracks, and edge sites of the 2D-layers. Therefore, either physisorption of the organometallic or other deposition-precursors at growth temperatures close to room temperature or metallic films and organic molecules as seed layers have been employed to achieve uniform deposition. Unfortunately, this additional treatment not only alters the properties of the 2D-material, but also introduces unfavorable additional properties into the resulting thin film stack.

Further, the substrate choice for the film growth is limited by cost and on-wafer integration. Thus, it would be highly beneficial to utilize ubiquitous substrates such as glass or silicon for easier integration into current silicon-based technology as well as the capability to transfer these functional thin films onto flexible substrates after the deposition. Current methods for the growth of thin film oxides require high processing temperature, which would not be suitable for polymer-based substrates. Likewise, it was demonstrated that growth of perovskite oxides on silicon typically leads to polycrystalline or amorphous films with drastically reduced functionality.

One solution to these problems is the use of van der Waals epitaxy (vdWE), which was applied by Koma et al. to thin film growth in the 1990's is an approach to produce oxide thin films on large lattice mismatch substrates. This process uses thin 2D sheets of layered material, which acts as a seed layer to promote crystalline and oriented growth of the thin film overlayers. The bonds between the 2D layer and the thin film are of van der Waals character and therefore significantly weaker than the ionic and/or covalent bonds typically formed between the film and single-crystalline substrates. Hence, a larger difference in the lattice mismatch and the thermal expansion coefficient can be accommodated without the formation of dislocations at the thin film-substrate interface. Recent works have used nanosheets of $Ca_2Nb_3O_{10}$, $MoO_2$, and graphene as seed layers to promote oriented thin film growth on various substrates. While these methods have proven that oriented crystalline growth is attainable on ubiquitous substrates, one downside of this approach is that the chemically distinct nanosheet seed layer with its properties inherently becomes a part of the thin film heterostructure, which is not always desirable, limiting its applicability.

The present disclosure is directed to addressing some of these deficiencies in the art.

SUMMARY

The present disclosure is directed to the use of MXene materials as templates for the deposition of perovskite, perovskite-type, and perovskite-like materials, for example, using and chemical or physical vapor deposition techniques, including atomic layer or pulsed laser deposition techniques, suitable for forming thin layers of these important dielectric and electroactive materials.

In part, the present disclosure describes the use of the 2D transition metal carbide $Ti_3C_2$ (MXene) as a decomposable seed layer, which does not require additional processing steps to remove it from the resulting thin film. As exemplified herein, $BaTiO_3$ (BTO) grown by pulsed laser deposition (PLD) was chosen as an exemplary candidate perovskite thin film material as its properties have been thoroughly characterized over the last several decades, but the principles described are seen as more generally applicable to other perovskite and MXene materials. Among a variety of MXenes available to date, $Ti_3C_2$ was chosen as a seed layer of the BTO growth because it can be produced in large quantities with controlled flake size, and it can be coated on various substrates from solution. Moreover, we demonstrated that the Ti atoms of the MXene layer can be readily incorporated into the BTO structure during the growth process.

In some embodiments, BTO thin films are deposited by PLD, onto fused silica and (111) Pt/Si substrates with a thin (~5 or 40 nm thick) MXene film on top. Results revealed a strong templating effect of MXene on highly oriented growth of BTO film along the (111) direction. Results suggested that the degree of orientation can be controlled by the initial flake size of the MXene film. Atomic force microscopy images revealed a strong resemblance of the initial MXene flakes for the PLD-grown BTO film surface, whereas the interface between Pt and BTO thin film showed a negligible amount of amorphous material and defects. Switching Spectroscopy Piezoresponse Force Microscopy (SS-PFM) gave the iconic "butterfly" loop demonstrating the ferroelectric nature of the BTO film grown on the MXene seed layer.

Again, while the present disclosure exemplifies the use of the 2D transition metal carbide $Ti_3C_2$ (MXene) as a decomposable seed layer, the disclosure is not limited to this MXene composition, there appears to be an advantage of matching the metallic content of the MXene with the deposited perovskite materials. Also, while not limited to any particular substrate, non-conductive substrates are preferred, including those comprising organic polymer or inorganic glass or crystalline substrates (e.g., glass or silicon). Since MXene can be produced as a free-standing film, the perovskite, perovskite-type, or perovskite-like structures can be prepared on almost any substrate materials.

Additional embodiments include the compositions prepared by these methods and articles comprising these compositions. Additional embodiments provide methods for preparing an oriented perovskite, perovskite-type, or perovskite-like film, the method comprising:

(a) depositing at least one perovskite, perovskite-type, or perovskite-like composition or precursor composition using chemical vapor deposition (CVD), physical vapor deposition (PVD), or atomic layer depostion (ALD) onto a film or layer of a MXene composition supported on a substrate to form a layered composition or precursor composition; and either (b)(1) heat treating or annealing the layered precursor composition to form a layered perovskite-type structure comprising at least one oriented perovskite, perovskite-type, or perovskite-like composition; or (2) annealing the layered composition; or (3) both (1) and (2).

Note that the methods involving chemical or physical vapor deposition and the methods involving atomic layer deposition result in different deposited materials, resulting from the different process conditions (the former using much higher processing temperatures than the latter). CVD and PVD tends to result in the deposition of crystalline materials, whereas ALD tends to produce amorphous materials, which become crystalline only on further heat treatment. As such, the two types of methods described may be viewed as independent embodiments.

In some embodiments, layers of the MXene composition are deposited onto the substrate before depositing the at least one perovskite, perovskite-type, or perovskite-like precursor composition, where the depositing can be by spray, spin, or dip coating. Exemplary MXene compositions comprise:

(a) at least one layer having first and second surfaces, each layer described by a formula $M_{n+1}X_nT_x$ and comprising:

substantially two-dimensional array of crystal cells, each crystal cell having an empirical formula of $M_{n+1}X_n$, such that each X is positioned within an octahedral array of M, wherein M is at least one Group IIIB, IVB, VB, or VIB metal or Mn, wherein each X is C, N, or a combination thereof;

n=1, 2, or 3; and wherein

Tx represents surface termination groups, described elsewhere herein; or (b) at least one layer having first and second surfaces, each layer comprising: a substantially two-dimensional array of crystal cells, each crystal cell having an empirical formula of $M'_2M''_nX_{n+1}T_x$, such that each X is positioned within an octahedral array of M' and M'', and where M''n are present as individual two-dimensional array of atoms intercalated between a pair of two-dimensional arrays of M' atoms, wherein M' and M'' are different Group IIIB, IVB, VB, or VIB metals, wherein each X is C, N, or a combination thereof;

n=1 or 2; and wherein $T_x$ represents surface termination groups, described elsewhere herein.

Exemplary methods for depositing the perovskite, perovskite-type, or perovskite-like precursor compositions include atomic layer deposition (ALD) or pulsed layer deposition (PLD).

The methods appear flexible in their ability to accommodate and prepare a range perovskite, perovskite-type, and perovskite-like materials. These types of materials are specifically described elsewhere herein, but includes doped and undoped, simple and complex perovskites and perovskite-like materials of the general formula $ABX_3$, $A_{m-1}Bi_2M_mO_{3m+3}$, $A_{m+1}M_mO_{3m+1}$, and $A_mM_mO_{3m+2}$, where A, B, X, M, m, and n are described elsewhere herein. Barium titanate ($BaTiO_3$, or BTO), and precursors thereof, has been shown to be especially receptive to the methods described herein.

The MXene layer may be superposed on a metallic layer or directly on an organic or inorganic substrate, such an inorganic oxide, such as silicon oxide (e.g., an oxide coating on silicon or quartz). Multiple layers of the oriented perovskite, perovskite-type, or perovskite-like material may also be prepared by the disclosed methods. In some embodiments, the methods provide layered product compositions comprising a substrate, a layer of MXene, and at least one layer of oriented perovskite, perovskite-type, or perovskite-like material (or precursor thereof).

This application further discloses compositions or structures comprising a dielectric substrate and at least one layer of a perovskite, perovskite-type, or perovskite-like composition or precursor composition or oriented perovskite, perovskite-type, or perovskite-like material superposed thereon. The compositions may further comprise at least one metallic layer, wherein the metallic layer is sandwiched between the dielectric substrate and the at least one layer of perovskite, perovskite-type, or perovskite-like material precursor or oriented perovskite, perovskite-type, or perovskite-like material. In still other embodiments, the compositions further comprise at least one MXene layer sandwiched between the dielectric substrate and the at least one layer of perovskite, perovskite-type, or perovskite-like material precursor or oriented perovskite, perovskite-type, or perovskite-like composition or sandwiched between the metallic layer and the at least one layer of perovskite, perovskite-type, or perovskite-like precursor composition or oriented perovskite, perovskite-type, or perovskite-like composition.

BRIEF DESCRIPTION OF THE DRAWINGS

The present application is further understood when read in conjunction with the appended drawings. For the purpose of illustrating the subject matter, there are shown in the drawings exemplary embodiments of the subject matter; however, the presently disclosed subject matter is not limited to the specific methods, devices, and systems disclosed. In addition, the drawings are not necessarily drawn to scale. In the drawings:

FIGS. 2(D-F) provide schematic representations showcasing the different film stacks where $SrRuO_3$ was used as the bottom electrode on the surface of quartz slides and commercially available Pt(111)/Ti/SiO$_2$/Si(001) wafers. Two methods, spray coating (SC) and dip coating (DC), were used to deposit MXene solution onto the substrates following prior techniques. The film in FIG. 2(D) had spray-coated MXene with a thickness of about 5 nm. $SrRuO_3$ (SRO) was used as a bottom electrode and was deposited by PLD. Without breaking vacuum, BTO was deposited onto the quartz/MXene/SRO heterostructure. Platinum top electrodes were deposited ex-situ by sputtering at room temperature. A similar procedure was followed to make the other samples shown in FIG. 2(E) and FIG. 2(F).

FIG. 5(A-E) shows PFM images and SS-PFM loops of a Pt-Silicon/Ti$_3$C$_2$/BTO sample.

DETAILED DESCRIPTION OF ILLUSTRATIVE EMBODIMENTS

The present disclosure is directed to methods of depositing ordered perovskite, perovskite-type, and perovskite-like compositions or precursor compositions, using MXenes as templates for the deposition. Additional embodiments include those compositions and structures derived from these methods, the compositions exhibiting ordered crystallinity and associated superior dielectric and electronic properties, relative to those coatings made in the absence of using the MXene templates. Additional embodiments include devices comprising these coatings or layered compositions.

Figure 1:
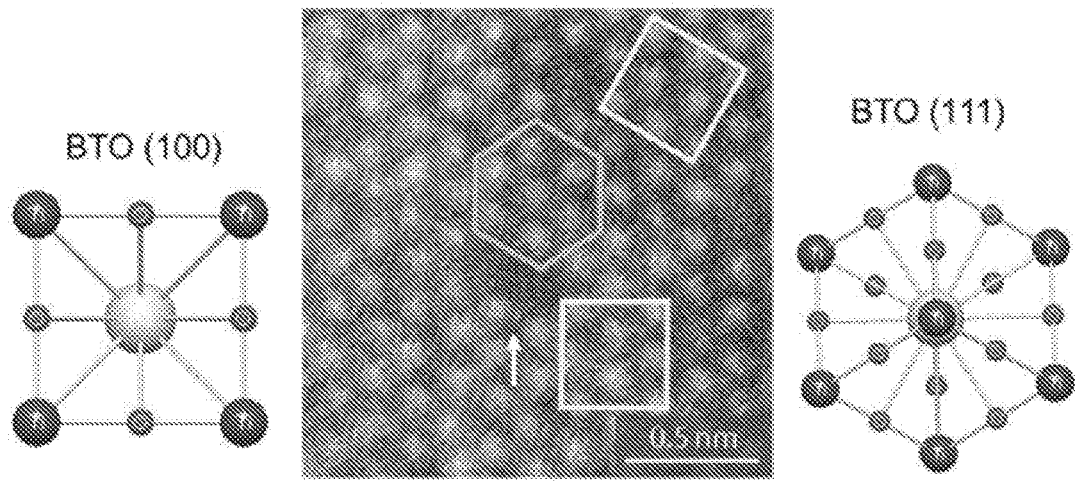
FIG. 1 provides a representation of the alignment of crystal indices of $BaTiO_3$ ("BTO") on a MX-ene surface.

As described herein, MXene not only serves as a conductive bottom electrode, its inherent structure with transition metal ions forming a hexagonal pattern at the top surface promotes the growth of the perovskite layer in distinct orientations, namely [100] and [111] (see FIG. 1). Furthermore, the flat top surface of the MXene flakes considerably improves the smoothness of the perovskite films compared to a simple Si—SiO$_2$ surface. These results imply a superior and scaleable procedure to grow oriented perovskite oxides on a conductive substrate. Compared to similar effects of perovskite oxide on graphene the possibility to modify the MXene layer toward a specific chemical and structural base for the perovskite, perovskite-type, and perovskite-like film growth sets this method apart from any known other method for oriented growth of perovkite oxides.

Additional advantages of using MXene materials as a bottom electrode and/or substrate for perovskite, perovskite-type, or perovskite-like materials includes (1) the ability to use substrates having larger areas and that are less expensive than semi-crystalline substrates; (2) no or reduced strain because of heteroepitaxy; (3) improved ferroelectric or dielectric properties compared with similar structures on Pt, Cu, or other metallic foils; and (4) the ability to target substrate properties for specific applications.

The present disclosure may be understood more readily by reference to the following description taken in connection with the accompanying Figures and Examples, all of which form a part of this disclosure. It is to be understood that this disclosure is not limited to the specific products, methods, conditions or parameters described or shown herein, and that the terminology used herein is for the purpose of describing particular embodiments by way of example only and is not intended to be limiting of any claimed invention. Similarly, unless specifically otherwise stated, any description as to a possible mechanism or mode of action or reason for improvement is meant to be illustrative only, and the disclosure herein is not to be constrained by the correctness or incorrectness of any such suggested mechanism or mode of action or reason for improvement. Throughout this text, it is recognized that the descriptions refer to compositions and methods of making and using said compositions. That is, where the disclosure describes or claims a feature or embodiment associated with a composition or a method of making or using a composition, it is appreciated that such a description or claim is intended to extend these features or embodiment to embodiments in each of these contexts (i.e., compositions, methods of making, and methods of using). Addition, where an embodiment discloses a composition comprising an oriented perovskite or perovskite layer or material, it is to be appreciated that other embodiments are intended to include those compositions where a companion composition exists comprising the perovskite (including—like or —type) or perovskite precursor compositions.

Certain specific embodiments include methods preparing an oriented perovskite, perovskite-type, or perovskite-like film, the methods comprising:

(a) depositing at least one perovskite, perovskite-type, or perovskite-like composition or precursor composition using chemical vapor deposition (CVD), physical vapor deposition (PVD), or atomic layer deposition (ALD) onto a film or layer of a MXene composition supported on a substrate to form a layered composition or precursor composition; and either (b) (1) heat treating or annealing the layered precursor composition to form a layered perovskite-type structure comprising at least one oriented perovskite, perovskite-type, or perovskite-like composition; or (2) annealing the layered composition; or (3) both (1) and (2).

Note that the methods involving chemical or physical vapor deposition and the methods involving atomic layer deposition result in different deposited materials, resulting from the different process conditions (the former using much higher processing temperatures than the latter). CVD and PVD tends to result in the deposition of crystalline materials, whereas ALD results in the deposition of amorphous materials, which become crystalline only on further heat treatment. As such, the two methods described may be viewed as independent embodiments. Without intending to be bound by the correctness of any particular theory, it is possible that CVD and PVD initially deposit amorphous precursor compositions as well, which are then crystallized by the inherent heat of these deposition methods. In this way, the deposition and subsequent heat treating may be viewed as simultaneously or sequentially being applied. Subsequent annealing for the crystalline films, typically under oxidizing atmospheres, reduces oxygen vacancies in the deposited crystalline lattices and improve the properties of the films.

For the avoidance of doubt, methods comprising each of oriented perovskite, perovskite-type, or perovskite-like composition or precursors are considered independent embodiments, as are compositions comprising each of oriented perovskite, perovskite-type, or perovskite-like composition or precursor compositions. As used herein, the term "perovskite, perovskite-type, or perovskite-like precursor composition" refers to a composition in which the perovskite, perovskite-type, or perovskite-like material are not yet oriented, and are present either as amorphous or microcrystalline materials, the latter being insufficient to exhibit distinct powder XRD patterns.

The MXene layers may be applied using any of the methods described elsewhere herein, but exemplary methods include spray, spin, roller, or dip coating, or ink-printing or lithographic patterning.

The chemical vapor deposition (CVD) or physical vapor deposition (PVD) technique may include any of the methods described elsewhere herein or as understood by a person skilled in the art of thin film deposition, but exemplary methods include atomic layer deposition (ALD) and pulsed layer deposition (PLD). Such methods allow for the deposition of precursors to allow for the preparation of at least one layer of oriented perovskite, perovskite-type, or perovskite-like material, or the direct deposition of the crystalline compositions, having a thickness in a range of from 1 or 2 to 50 nanometers. Thicker coatings may also be prepared to 100 nm, to 250 nm, or greater. Some exemplary conditions for the precursor deposition are provided in the Examples. Typically, the chemical or vapor deposition is conducted at a temperature in a range of from 500° C. to 900° C., for example 700° C., for a time sufficient to generate a film of desired thickness. Once formed, the film is annealed by slow cooling to a temperature in a range of from 200° C. to 300° C. in the presence of oxygen (for oriented oxide compositions).

The disclosed methods, and associated compositions and structures, include those where the layers of perovskite, perovskite-type, or perovskite-like precursor composition or crystalline compositions (and after heat treating the oriented perovskite, perovskite-type, or perovskite-like compositions) are superposed on the MXene compositions, which themselves are superposed on a substrate. The substrate may comprise a dielectric material, such as described elsewhere herein, for example including inorganic oxides, nitrides, carbides, oxynitrides, oxycarbides, or oxycarbonitrides, either as single or polycrystalline materials, or amorphous (non-crystalline) glass. Exemplary materials include silicon oxides (e.g., an oxide coating on silicon or quartz) or silicate glasses comprising silicon oxides are suitable substrate materials. Amorphous glasses or substrates coated by silicate materials appear to be preferred owing to the ability to provide very low surface roughnesses. In certain embodiments, the substrate is characterized as having an average surface roughness of less than about 10 nm. Other embodiments provide that the surface roughness is less than 100 nm, less than 50 nm, less than 25 nm, or less than 5 nm.

The substrates may also comprise a dielectric material having a conductive coating thereupon (i.e., interposed between the dielectric substrate and the MXene layer. The conductive coating may be metallic or a conductive metal oxide material, such as tin oxide or indium tin oxide.

The MXene compositions may comprise any of the compositions described elsewhere herein. Exemplary MXene compositions include those comprising:

(a) at least one layer having first and second surfaces, each layer described by a formula $M_{n+1}X_nT_x$ and comprising:

substantially two-dimensional array of crystal cells, each crystal cell having an empirical formula of $M_{n+1}X_n$, such that each X is positioned within an octahedral array of M, wherein M is at least one Group IIIB, IVB, VB, or VIB metal or Mn, wherein each X is C, N, or a combination thereof;

n=1, 2, or 3; and wherein $T_x$ represents surface termination groups; or (b) at least one layer having first and second surfaces, each layer comprising:

a substantially two-dimensional array of crystal cells, each crystal cell having an empirical formula of $M'_2M''_nX_{n+1}T_x$, such that each X is positioned within an octahedral array of M' and M'', and where $M''_n$ are present as individual two-dimensional array of atoms intercalated between a pair of two-dimensional arrays of M' atoms, wherein M' and M'' are different Group IIIB, IVB, VB, or VIB metals, wherein each X is C, N, or a combination thereof;

n=1 or 2; and wherein $T_x$ represents surface termination groups. In certain of these exemplary embodiments, the at least one of said surfaces of each layer has surface termination groups (Tx) comprising alkoxide, carboxylate, halide, hydroxide, hydride, oxide, sub-oxide, nitride, sub-nitride, sulfide, thiol, or a combination thereof. In certain preferred embodiments, the MXene composition has an empirical formula of $Ti_3C_2$. However, it should be appreciated that other MXene materials, having slightly different lattice parameters, may offer advantages in methods involving the deposition of perovskite, perovskite-type, or perovskite-like compositions, where the lattice parameters of the MXene composition are more closely matched to the intended perovskite, perovskite-type, or perovskite-like composition. Determining such matching in order to help with such selections is well within the skill of the artisan in this field.

The resulting perovskite, perovskite-type, or perovskite-like compositions useful in the present methods are described elsewhere herein, and the precursors to those compositions for the method described are also otherwise well-known. While barium titanate and its precursors have been shown to work well as described herein, other exemplary perovskite, perovskite-type, or perovskite-like materials may also be used. These include, for example, simple perovskites of the formula $ABO_3$ or more generally having the same type of crystal structure as calcium titanate ($CaTiO_3$) and/or with the formula $^{XII}A^{2+VI}B^{4-}X^{2-}_3$ with the oxygen in the face centers.

Complex perovskites, which include mixtures of simple perovskites, are also within the scope of the present disclosure.

In some embodiment, the perovskite materials also include perovskite-type materials, such as optionally doped titanates, niobates, tantalates, zirconates and optionally doped titanate, niobate, tantalate, nickelate, ruthenate, vanadate, or zirconate oxides, or hybrid organic-inorganic or all inorganic trihalide perovskite, including ferroelectric solid solutions with compositions near the morphotropic phase boundary. Exemplary compositions are also described elsewhere herein and others are known to those skilled in the art.

Also seen as within the scope of the present disclosure are those perovskite-like materials, including for example ferroelectric perovskite-like layered thin film superlattice materials The term "perovskite-like" usually refers to a number of interconnected oxygen octahedra. The layered perovskite-like materials can be classified under three general types:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5-}$, $Mo^{6+}$, $W^{6+}$, $Fe^{3+}$ and other ions that occupy oxygen octahedra; this group includes bismuth titanate, $Bi_4Ti_3O_{12}$;

(II) compounds having the formula $A_{m+1}M_mO_{3m+1}$, including compounds such as strontium titanates or ruthenates, $Sr_2TiO_4$, $Sr_3Ti_2O_7$ and $Sr_4Ti_3O_{10}$ and $Sr_2RuO_4$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$. These are also described more fully elsewhere herein.

Thus far, the inventive disclosure has been described in terms of methods, but the compositions or structures made as a result of the methods, including the intermediate compositions structures, are also seen as within the scope of the present disclosure. With regard to these products or intermediates, the terms "compositions" and "structures" may be used interchangeably to reflect their chemical and mechanical aspects.

That is, some embodiments provide compositions (or structures) comprising a dielectric substrate and at least one layer of perovskite, perovskite-type, or perovskite-like precursor material superposed thereon, and a MXene layer interposed therebetween. Such embodiments, for example, are present after deposition but before the heat treating steps associated with the disclosed methods. These compositions may arise from the methods in which the perovskite, perovskite-type, or perovskite-like precursors (e.g., prepared by ALD) are only partially annealed or are merely dried. Again, some embodiments include those compositions (structures) in which a metallic or otherwise conductive layer is interposed between the substrate dielectric and the oriented perovskite, perovskite-type, or perovskite-like precursor superposed thereon—i.e., where the composition may be described as a stacked assembly of dielectric substrate, optional conductive layer, MXene layer, and perovskite, perovskite-type, or perovskite-like precursor material. The perovskite, perovskite-type, or perovskite-like precursor material may be as-deposited, dried, and/or partially annealed.

Other embodiments provide compositions (or structures) comprising a dielectric substrate and at least one layer of oriented perovskite, perovskite-type, or perovskite-like material superposed thereon. Such embodiments, for example, result from the deposition and heat treating steps associated with the disclosed methods. Again, some embodiments include those compositions (structures) in which a metallic or otherwise conductive layer is interposed between the substrate dielectric and the oriented perovskite, perovskite-type, or perovskite-like compositions or precursor compositions are superposed thereon. As the methods describe the use of MXenes as templating layers, these compositions (structures) may or may not have residual MXene layers interposed between the dielectric substrate (optionally containing the conductive layer) and the oriented perovskite, perovskite-type, or perovskite-like material. These residual MXene layers are typically seen after ALD or other low temperature processing techniques, wherein the temperatures are insufficient to cause decomposition/migration of the MXene into the deposited materials. As demonstrated in the Examples, during the course of heat treating, and depending on the heat treating conditions, the MXene materials may to be considered to be incorporated into the lattice of the oriented perovskite, perovskite-type, or perovskite-like material. Alternatively, the thickness of the final MXene material may be too thin to be analytically discernible. Whether the MXene layer is or not present or detectable in the final annealed composition (structure), these compositions (structures) may be characterized by an interface otherwise devoid of any extraneous bonding agent, such as an adhesive. Rather, the oriented perovskite, perovskite-type, or perovskite-like material is or appears to be directly bonded to the substrate—i.e., chemically bonded or chemisorbed—even when the substrate is otherwise non-crystalline. Such bonding may be discernible from analysis of of the interface, for example by vibrational or photoemission spectroscopy, by XAFS (X-ray absorption fine structure), ESCA (Electron Spectroscopy for Chemical Analysis), AES (Auger Electron Spectroscopy), SIMS (Secondary Ion Mass Spectrometry), RBS (Rutherford Backscattering Spectrometry), SEM (Scanning Electron Microscopy), TEM (Transmission Electron Microscopy), or other methods typically for interrogating interfaces.

Embodiments of the present disclosure include methods comprising the use of MXenes as template materials for providing perovskite, perovskite-type, and perovskite-like layered structures having well-defined crystallinity, even at very thin layers. Other embodiments include those compositions, where the MXenes are present in the pre-annealed state—e.g., in stacked composition comprising layers of dielectric substrates, perovskite, perovskite-type, and/or perovskite-like precursors, and optional (metallic) conductors. MXene composition are known but not for this purpose. While the instant disclosure describes the use of $Ti_3C_2$, because of the convenient ability to prepare larger scale quantities of these materials, it is believed and expected that all other MXenes will perform similarly, and so all such MXene compositions are considered within the scope of this disclosure. In certain embodiments, the MXene composition is any of the compositions described in at least one of U.S. patent application Ser. No. 14/094,966 (filed Dec. 3, 2013), 62/055,155 (filed Sep. 25, 2014), 62/214,380 (filed Sep. 4, 2015), 62/149,890 (filed Apr. 20, 2015), 62/127,907 (filed Mar. 4, 2015) or International Applications PCT/US2012/043273 (filed Jun. 20, 2012), PCT/US2013/072733 (filed Dec. 3, 2013), PCT/US2015/051588 (filed Sep. 23, 2015), PCT/US2016/020216 (filed Mar. 1, 2016), or PCT/US2016/028,354 (filed Apr. 20, 2016), preferably where the MXene composition comprises titanium and carbon (e.g., $Ti_3C_2$, $Ti_2C$, $Mo_2TiC_2$, etc.). Each of these compositions is considered independent embodiment. Similarly, MXene carbides, nitrides, and carbonitrides are also considered independent embodiments. Various MXene compositions are described elsewhere herein, and these and other compositions, including coatings, stacks, laminates, molded forms, and other structures, described in the above-mentioned references are all considered within the scope of the present disclosure.

Where the MXene material is present as a coating on a conductive or non-conductive substrate, that MXene coating may cover some or all of the underlying substrate material. Such substrates may be virtually any conducting or non-conducting material, though preferably the MXene coating is superposed on a non-conductive surface. Such non-conductive surfaces or bodies may comprise virtually any non-electrically conducting organic polymer, inorganic material (e.g., glass or silicon). Since MXene can be produced as a free-standing film, or applied to any shaped surface, in principle the MXene can be applied to almost any substrate material, depending on the intended application, with little dependence on morphology and roughness. In independent embodiments, the substrate may be a non-porous, porous, microporous, or aerogel form of an organic polymer, for example, a fluorinated or perfluorinated polymer (e.g., PVDF, PTFE) or an alginate polymer, a silicate glass, silicon, GaAs, or other low-K dielectric, an inorganic carbide (e.g., SiC) or nitride ($Al_3N_4$) or other thermally conductive inorganic material wherein the choice of substrate depends on the intended application. Depending on the nature of the application, low-k dielectrics or high thermal conductivity substrates may be used.

In some embodiments, the substrate is rigid (e.g., on a silicon wafer). In other embodiments, substrate is flexible (e.g., on a flexible polymer sheet). Substrate surfaces may be organic, inorganic, or metallic, and comprise metals (Ag, Au, Cu, Pd, Pt) or metalloids; conductive or non-conductive metal oxides (e.g., $SiO_2$, ITO), nitrides, or carbides; semiconductors (e.g., Si, GaAs, InP); glasses, including silica or boron-based glasses; or organic polymers.

The coating may be patterned or unpatterned on the substrate. In independent embodiments, the coatings may be applied or result from the application by spin coating, dip coating, roller coating, compression molding, doctor blading, ink printing, painting or other such methods. Multiple coatings of the same or different MXene compositions may be employed.

Flat surface or surface-patterned substrates can be used. The MXene coatings may also be applied to surfaces having patterned metallic conductors or wires. Additionally, by combining these techniques, it is possible to develop patterned MXene layers by applying a MXene coating to a photoresist layer, either a positive or negative photoresist, photopolymerize the photoresist layer, and develop the photopolymerized photoresist layer. During the developing stage, the portion of the MXene coating adhered to the removable portion of the developed photoresist is removed. Alternatively, or additionally, the MXene coating may be applied first, followed by application, processing, and development of a photoresist layer. By selectively converting the exposed portion of the MXene layer to an oxide using nitric acid, a MXene pattern may be developed. In short, these MXene materials may be used in conjunction with any appropriate series of processing steps associated with thick or thin film processing to produce any of the structures or devices described herein (including, e.g., plasmonic nanostructures).

The methods described in PCT/US2015/051588 (filed Sep. 23, 2015), incorporated by reference herein at least for such teachings, are suitable for such applications.

In independent embodiments, the MXene coating can be present and is operable, in virtually any thickness, from the nanometer scale to hundreds of microns. Within this range, in some embodiments, the MXene may be present at a thickness ranging from 1-2 nm to 1000 microns, or in a range defined by one or more of the ranges of from 1-2 nm to 25 nm, from 25 nm to 50 nm, from 50 nm to 100 nm, from 100 nm to 150 nm, from 150 nm to 200 nm, from 200 nm to 250 nm, from 250 nm to 500 nm, from 500 nm to 1000 nm, from 1000 nm to 1500 nm, from 1500 nm to 2500 nm, from 2500 nm to 5000 nm, from 5 µm to 100 µm, from 100 µm to 500 µm, or from 500 µm to 1000 µm.

Typically, in such coatings, the MXene is present as an overlapping array of two or more overlapping layers of MXene platelets oriented to be essentially coplanar with the substrate surface. In specific embodiments, the MXene platelets have at least one mean lateral dimension in a range of from about 0.1 micron to about 50 microns, or in a range defined by one or more of the ranges of from 0.1 to 2 microns, from 2 microns to 4 microns, from 4 microns to 6 microns, from 6 microns to 8 microns, from 8 microns to 10 microns, from 10 microns to 20 microns, from 20 microns to 30 microns, from 30 microns to 40 microns, or from 40 microns to 50 microns.

Again, the substrate may also be present such that its body is a molded or formed body comprising the MXene composition. While such compositions may comprise any of the MXene compositions described herein, exemplary methods of making such structures are described in PCT/US2015/051588 (filed Sep. 23, 2015), which is incorporated by reference herein at least for such teachings.

To this point, the disclosure(s) have been described in terms of the methods and derived coatings or compositions themselves, the disclosure also contemplates that devices incorporating or comprising these thin films are considered within the scope of the present disclosure(s). Additionally, any of the devices or applications described or discussed elsewhere herein, including the Background, are considered within the scope of the present disclosure(s)

Terms

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When a value is expressed as an approximation by use of the descriptor "about," it will be understood that the particular value forms another embodiment. In general, use of the term "about" indicates approximations that can vary depending on the desired properties sought by the disclosed subject matter and is to be interpreted in the specific context in which it is used, based on its function. The person skilled in the art will be able to interpret this as a matter of routine. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, references to values stated in ranges include every value within that range.

It is to be appreciated that certain features of the disclosure which are, for clarity, described herein in the context of separate embodiments, may also be provided in combination in a single embodiment. That is, unless obviously incompatible or specifically excluded, each individual embodiment is deemed to be combinable with any other embodiment(s) and such a combination is considered to be another embodiment. Conversely, various features of the disclosure that are, for brevity, described in the context of a single embodiment, may also be provided separately or in any sub-combination. Finally, while an embodiment may be described as part of a series of steps or part of a more general structure, each said step may also be considered an independent embodiment in itself, combinable with others.

When a list is presented, unless stated otherwise, it is to be understood that each individual element of that list, and every combination of that list, is a separate embodiment. For example, a list of embodiments presented as "A, B, or C" is to be interpreted as including the embodiments, "A," "B," "C," "A or B," "A or C," "B or C," or "A, B, or C."

The transitional terms "comprising," "consisting essentially of," and "consisting" are intended to connote their generally in accepted meanings in the patent vernacular; that is, (i) "comprising," which is synonymous with "including," "containing," or "characterized by," is inclusive or open-ended and does not exclude additional, unrecited elements or method steps; (ii) "consisting of" excludes any element, step, or ingredient not specified in the claim; and (iii) "consisting essentially of" limits the scope of a claim to the specified materials or steps "and those that do not materially affect the basic and novel characteristic(s)" of the claimed disclosure. Embodiments described in terms of the phrase "comprising" (or its equivalents), also provide, as embodiments, those which are independently described in terms of "consisting of" and "consisting essentially of." Where the term "consisting essentially of" is used, the basic and novel characteristic(s) of the method is intended to be the ability to provide ordered perovskite, perovskite-type, and perovskite-like films using MXene materials, which exhibit the crystallinity and properties described herein.

Throughout this specification, words are to be afforded their normal meaning, as would be understood by those skilled in the relevant art. However, so as to avoid misunderstanding, the meanings of certain terms will be specifically defined or clarified.

While MXene compositions include any and all of the compositions described in the patent applications and issued patents described above, in some embodiments, MXenes are materials comprising or consisting essentially of a $M_{n+1}X_n(T_s)$ composition having at least one layer, each layer having a first and second surface, each layer comprising a substantially two-dimensional array of crystal cells.

each crystal cell having an empirical formula of $M_{n+1}X_n$, such that each X is positioned within an octahedral array of M, wherein M is at least one Group 3, 4, 5, 6, or 7, or Mn, wherein each X is carbon and nitrogen or combination of both and n=1, 2, or 3;

wherein at least one of said surfaces of the layers has surface terminations, $T_s$, independently comprising alkoxide, alkyl, carboxylate, halide, hydroxide, hydride, oxide, sub-oxide, nitride, sub-nitride, sulfide, sulfonate, thiol, or a combination thereof;

As described elsewhere within this disclosure, the $M_{n+1}X_n(T_s)$ materials produced in these methods and compositions have at least one layer, and sometimes a plurality of layers, each layer having a first and second surface, each layer comprising a substantially two-dimensional array of crystal cells; each crystal cell having an empirical formula of $M_{n+1}X_n$, such that each X is positioned within an octahedral array of M, wherein M is at least one Group 3, 4, 5, 6, or 7 metal (corresponding to Group IIIB, IVB, VB, VIB or VIIB metal or Mn), wherein each X is C and/or N and n=1, 2, or 3; wherein at least one of said surfaces of the layers has surface terminations, $T_s$, comprising alkoxide, alkyl, carboxylate, halide, hydroxide, hydride, oxide, sub-oxide, nitride, sub-nitride, sulfide, sulfonate, thiol, or a combination thereof.

Supplementing the descriptions above, $M_{n+1}X_n(T_s)$, compositions may be viewed as comprising free standing and stacked assemblies of two dimensional crystalline solids. Collectively, such compositions are referred to herein as "$M_{n+1}X_n(T_s)$," "MXene," "MXene compositions," or "MXene materials." Additionally, these terms "$M_{n+1}X_n(T_s)$," "MXene," "MXene compositions," or "MXene materials" also refer to those compositions derived by the chemical exfoliation of MAX phase materials, whether these compositions are present as free-standing 2-dimensional or stacked assemblies (as described further below). Reference to the carbide equivalent to these terms reflects the fact that X is carbon, C, in the lattice. Such compositions comprise at least one layer having first and second surfaces, each layer comprising: a substantially two-dimensional array of crystal cells; each crystal cell having an empirical formula of $M_{n+1}X_n$, where M, X, and n are defined above. These compositions may be comprised of individual or a plurality of such layers. In some embodiments, the $M_{n+1}X_n(T_s)$ MXenes comprising stacked assemblies may be capable of, or have atoms, ions, or molecules, that are intercalated between at least some of the layers. In other embodiments, these atoms or ions are lithium. In still other embodiments, these structures are part of an energy-storing device, such as a battery or supercapacitor. In still other embodiments these structures are added to polymers to make polymer composites.

The term "crystalline compositions comprising at least one layer having first and second surfaces, each layer comprising a substantially two-dimensional array of crystal cells" refers to the unique character of these MXene materials. For purposes of visualization, the two-dimensional array of crystal cells may be viewed as an array of cells extending in an x-y plane, with the z-axis defining the thickness of the composition, without any restrictions as to the absolute orientation of that plane or axes. It is preferred that the at least one layer having first and second surfaces contain but a single two-dimensional array of crystal cells (that is, the z-dimension is defined by the dimension of approximately one crystal cell), such that the planar surfaces of said cell array defines the surface of the layer; it should be appreciated that real compositions may contain portions having more than single crystal cell thicknesses.

That is, as used herein, "a substantially two-dimensional array of crystal cells" refers to an array which preferably includes a lateral (in x-y dimension) array of crystals having a thickness of a single cell, such that the top and bottom surfaces of the array are available for chemical modification.

Metals of Group 3, 4, 5, 6, or 7 (corresponding to Group IIIB, IVB, VB, VIB, or VIIB), either alone or in combination, said members including Ti, Zr, Hf, V, Nb, Ta, Cr, Mo, and W. For the purposes of this disclosure, the terms "M" or "M atoms," "M elements," or "M metals" may also include Mn. Also, for purposes of this disclosure, compositions where M comprises Ti, Zr, Hf, V, Nb, Ta, Cr, Mo, W, or mixtures thereof constitute independent embodiments. Similarly, the oxides of M may comprise any one or more of these materials as separate embodiments. For example, M may comprise any one or combination of Hf, Cr, Mn, Mo, Nb, Sc, Ta, Ti, V, W, or Zr. In other preferred embodiments, the transition metal is one or more of Ti, Zr, V, Cr, Mo, Nb, Ta, or a combination thereof. In even more preferred embodiments, the transition metal is Ti, Ta, Mo, Nb, V, Cr, or a combination thereof. Specific MXene metals may be used to provide dopant effects in the perovskite, perovskite-type, or perovskite-like lattices, or may be chosen to be chemically identical to one or more of the perovskite, perovskite-type, or perovskite-like lattices.

In certain specific embodiments, $M_{n+1}X_n$ comprises $M_{n+1}C_n$ (i.e., where X=C, carbon) which may be $Ti_2C$, $V_2C$, $V_2N$, $Cr_2C$, $Zr_2C$, $Nb_2C$, $Hf_2C$, $Ta_2C$, $Mo_2C$, $Ti_3C_2$, $V_3C_2$, $Ta_3C_2$, $Mo_3C_2$, $(Cr_{2/3}Ti_{1/2})_3C_2$, $Ti_4C_3$, $V_4C_3$, $Ta_4C_3$, $Nb_4C_3$, or a combination thereof.

In more specific embodiments, the $M_{n+1}X_n(T_s)$ crystal cells have an empirical formula $Ti_3C_2$ or $Ti_2C$. In certain of these embodiments, at least one of said surfaces of each layer of these two dimensional crystal cells is coated with surface terminations, Ts, comprising alkoxide, fluoride, hydroxide, oxide, sub-oxide, sulfonate, or a combination thereof.

The range of compositions available can be seen as extending even further when one considers that each M-atom position within the overall $M_{n+1}X_n$ matrix can be represented by more than one element. That is, one or more type of M-atom can occupy each M-position within the respective matrices. In certain exemplary non-limiting examples, these can be $(M^A_xM^B_y)_2C$, $(M^A_xM^B_y)_3C_2$, or where $M^A$ and $M^B$ are independently members of the same group, and x+y=1. For example, in but one non-limiting example, such a composition can be $(V_{1/2}Cr_{1/2})_3C_2$.

As used herein, the term perovskites refer to those crystalline compositions of the general formula $ABO_3$, or more generally refers to any material with the same type of crystal structure as calcium titanium oxide ($CaTiO_3$), known as the perovskite structure, or $^{XII}A^{2+}\,^{VI}B^{4+}X^{2-}_3$ with the oxygen in the face centers. The perovskite structure is adopted by many oxides that have the chemical formula $ABO_3$. Simple perovskites include, but are not limited to, barium titanate ($BaTiO_3$), strontium titanate ($SrTiO_3$), strontium ruthenate ($SrRuO_3$), calcium titanate ($CaTiO_3$), lead titanate ($PbTiO_3$), barium zirconate ($BaZrO_3$), strontium zirconate ($SrZrO_3$), calcium zirconate ($CaZrO_3$), lead zirconate ($PbZrO_3$), bismuth ferrite ($BiFeO_3$), lanthanum ytterbium oxide ($LaYbO_3$).

Complex perovskites include mixtures of simple perovskites, such as barium strontium titanate, lead zirconate titanate ($Pb[Zr_xTi_{1-x}]O_3$ ($0 \leq x \leq 1$)), lead magnesium niobate ($PbMg_{1/3}Nb_{2/3}O_3$) or lead titanate-lead magnesium niobate ($[PbTiO_3]_x[Pb[Mg_{1/3}Nb_{2/3}O_3]_{1-x}$ ($0 \leq x \leq 1$)). Other materials include, for example, lanthanum strontium manganite ($La_{1-x}Sr_xMnO_3$, where x describes the doping level and for some applications it is in the range of 10-20%.), LSAT (lanthanum aluminate—strontium aluminum tantalate)(or $(LaAlO_3)_{0.3}(Sr_2TaAlO_6)_{0.7})$, and lead scandium tantalate ($Pb(Sc_xTa_{1-x})O_3$, where x is usually about 0.5).

The perovskite materials include perovskite-type materials, such as optionally doped titanates, niobates, tantalates, zirconates and optionally doped titanate, niobate, tantalate, or zirconate oxides. Other such materials may also include hybrid organic-inorganic or all inorganic trihalide perovskite, e.g. $MAPbI_3$, $MAPbBr_3$, $FASnCl_3$, $CsSnI_3$ or cation and/or anion solid solutions thereof. Also included are $BaTiO_3$, KBNNO (potassium barium nickel niobate), $BiFeO_3$, $LaCoO_3$-doped $Bi_4Ti_3O_{12}$, $KBiFe_2O_5$, cation-ordered $Bi(Fe,Cr)O_3$, non-oxide ferroelectrics, e.g. non-centrosymmetric perovskite lead and/or tin trihalides, e.g. $APbX_3$, $APb_xSn_{1-x}X_3$, where A denotes a methylammonium molecule (MA) or similar polar ion or Cs ion, and X denotes a trihalide ion (i.e. I, Br or Cl) or mixture thereof, and $Pb_{1-x}La_xZr_yTi_{1-y}O_3$ (x=0.03, y=0.52) (PLZT). It is well known to those skilled in the art that ferroelectric solid solutions with compositions near the morphotropic phase boundary, e.g., $PbZr_{0.52}Ti_{0.48}O_3$ [PLZT (3/52/48)] or even relaxor ferroelectrics, e.g. solid solutions of lead titanate (PT) with lead zinc niobate (PZN-PT) or lead magnesium niobate (PMN-PT), $Pb_{0.78}Ba_{0.22}Sc_{0.5}Ta_{0.5}O_3$, etc. exhibit the highest piezoelectric coefficients.

Also seen as within the scope of the present disclosure are those perovskite-like materials. Ferroelectric perovskite-like layered thin film superlattice materials are a known class of self-ordering crystals, and have been used in thin films suitable for use in integrated circuits, e.g., as reported in U.S. Pat. No. 5,519,234 issued May 21, 1996 to Araujo et al. The term "perovskite-like" usually refers to a number of interconnected oxygen octahedra. A primary cell is typically formed of an oxygen octahedral positioned within a cube that is defined by large A-site metals where the oxygen atoms occupy the planar face centers of the cube and a small B-site element occupies the center of the cube. In some instances, the oxygen octahedra may be preserved in the absence of A-site elements. The layered perovskite-like materials can be classified under three general types:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5-}$, $Mo^{6+}$, $W^{6+}$, $Fe^{3+}$ and other ions that occupy oxygen octahedra; this group includes bismuth titanate, $Bi_4Ti_3O_{12}$;

(II) compounds having the formula $A_{m+1}MmO_{3m+1}$, including compounds such as strontium titanates or ruthenates, $Sr_2TiO_4$, $Sr_3Ti_2O_7$, $Sr_4Ti_3O_{10}$, and $Sr_2RuO_4$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$.

As used herein, the methods of deposition include chemical vapor deposition or physical vapor deposition or atomic layer deposition.

Chemical vapor deposition methods include atmospheric pressure, low-pressure (LPCVD), and ultrahigh vaccum deposition (UHVCVD), as reconized by those skilled in the art. Within these categories, various methods include aerosol assisted CVD (AACVD), direct liquid injection CVD (DLICVD), hot wall, cold wall CVD, microwave plasma-assisted CVD (MPCVD), plasma-enhanced CVD (PECVD), remote plasma-enhanced CVD (RPECVD), atomic-layer CVD (ALCVD), combustion chemical vapor deposition (CCVD), hot filament CVD (HFCVD, hybrid physical-chemical vapor deposition (HPCVD), metallorganic chemical vapor deposition (MOCVD), rapid thermal CVD (RT-CVD), vapor-phase epitaxy (VPE), and photo-initiated CVD (PICVD).

Physical vapor deposition methods include cathodic arc deposition, electron beam physical vapor deposition, evaporative deposition, pulsed laser deposition, sputter deposition, pulsed electron deposition, and sublimation sandwich method.

As used herein, the term "heat treating", "annealing" or "sintering" both refer to a process involving the application of heat, during, after, or both during and after the deposition of the precursor materials. The processes used in chemical and physical vapor depositions are known to those skilled in the art of these practices. Typically, the heat treating comprises exposing a composition or material to a temperature in a range of 500° C. to 900° C. to facilitate crystal growth, as is necessary to convert an amorphous or semi- or quasi-crystalline material to the oriented crystalline materials described herein, and slowly cooling the material. In the case of perovskite and other ceramic oxides, sintering is typically done in the presence of an oxidizing atmosphere, for example, in the presence of oxygen gas. Annealing is typically done by slow cooling and holding of a sintered material at a temperature in a range of from 150° C. to 300° C. before cooling to ambient temperatures.

As used herein, the term "oriented" as in "oriented perovskite, perovskite-type, or perovskite-like materials" refers to the crystallographic orientation of the polycrystalline or crystalline material, such that the layer exhibits XRD patterns similar to and approaching those for single crystals of the same material; i.e., a reflectance attributable to a given orientation is substantially more intense than it would be in the XRD patterns of a randomly packed powder of the same material.

The following listing of Embodiments is intended to complement, rather than displace or supersede, the previous descriptions.

Embodiment 1. A method for preparing an oriented perovskite, perovskite-type, or perovskite-like film, the method comprising:

(a) depositing at least one perovskite, perovskite-type, or perovskite-like composition or precursor composition using chemical vapor deposition (CVD), physical vapor deposition (PVD), or atomic layer depostion (ALD) onto a film or layer of a MXene composition supported on a substrate to form a layered composition or precursor composition; and either (b)(1) heat treating or annealing the layered precursor composition to form a layered perovskite-type structure comprising at least one oriented perovskite, perovskite-type, or perovskite-like composition; or (2) annealing the layered composition.

In certain independent Aspects of this Embodiment, the methods comprise chemical or physical vapor deposition, including pulsed layer deposition (PLD) or similar methods, involving high temperature processing of the films onto the substrate and resulting in crystalline or semi-crystalline perovskite, perovskite-type, or perovskite-like oxide films, optionally followed by post-deposition annealing under oxidizing conditions. In other Aspects of this Embodiment, the methods comprise atomic layer deposition or similar methods involving low temperature deposition of the films onto the surface to form amorphous or semicrystalline at least one perovskite, perovskite-type, or perovskite-like precursor composition, followed by heat treating or annealing under oxidizing conditions to form the layered perovskite-type structure comprising at least one oriented perovskite, perovskite-type, or perovskite-like composition.

Embodiment 2. The method of Embodiment 1, further comprising depositing a layer of MXene composition onto the substrate before depositing the at least one perovskite, perovskite-type, or perovskite-like precursor composition, where the depositing can be by spray, spin, roller, or dip coating. In other Aspects of this Embodiment, the MXene layer may be patterned, for example formed by ink printing or lithographic patterning.

Embodiment 3. The method of Embodiment 1 or 2, wherein the depositing is by atomic layer deposition (ALD), Embodiment 4. The method of any one of Embodiments 1 to 3, wherein the depositing is by pulsed layer deposition (PLD), Embodiment 5. The method of any one of Embodiments 1 to 4, wherein the MXene composition comprises:

(a) at least one layer having first and second surfaces, each layer described by a formula $M_{n+1}X_nT_x$ and comprising:

substantially two-dimensional array of crystal cells, each crystal cell having an empirical formula of $M_{n+1}X_n$, such that each X is positioned within an octahedral array of M, wherein M is at least one Group IIIB, IVB, VB, or VIB metal or Mn, wherein each X is C, N, or a combination thereof;

n=1, 2, or 3; and wherein $T_x$ represents surface termination groups; or (b) at least one layer having first and second surfaces, each layer comprising:

a substantially two-dimensional array of crystal cells, each crystal cell having an empirical formula of $M'_2M''_nX_{n+1}T_x$, such that each X is positioned within an octahedral array of M' and M'', and where M''$_n$ are present as individual two-dimensional array of atoms intercalated between a pair of two-dimensional arrays of M' atoms, wherein M' and M" are different Group IIIB, IVB, VB, or VIB metals, wherein each X is C, N, or a combination thereof;

n=1 or 2; and wherein $T_x$ represents surface termination groups.

Embodiment 6. The method of Embodiment 5, wherein at least one of said surfaces of each layer has surface termination groups ($T_x$) comprising alkoxide, carboxylate, halide, hydroxide, hydride, oxide, sub-oxide, nitride, sub-nitride, sulfide, thiol, or a combination thereof.

Embodiment 7. The method of any one Embodiments 1 to 5, wherein the crystal cell of the MXene composition has an empirical formula of $Ti_3C_2$.

Embodiment 8. The method of any one of Embodiments 1 to 7, wherein the perovskite is of any of the formulae described herein.

Embodiment 9. The method of any one of Embodiments 1 to 8, wherein the perovskite-type or perovskite-like material is any of the formulae described herein.

Embodiment 10. The method of any one of Embodiments 1 to 9, wherein the perovskite is barium titanate.

Embodiment 11. The method of any one of Embodiments 1 to 10, wherein the MXene is superposed on a metallic layer.

Embodiment 12. The method of any one of Embodiments 1 to 11, wherein the substrate is an inorganic oxide, such as silicon oxide (e.g., an oxide coating on silicon or quartz).

Embodiment 13. The method of any one of claims 1 to 12, wherein the layered product composition comprises the substrate and the at least one layer of oriented perovskite, perovskite-type, or perovskite-like material.

Embodiment 14. The method of any one of Embodiments 1 to 13, wherein the layered product composition comprises the substrate, the MXene, and at least one layer of oriented perovskite, perovskite-type, or perovskite-like material.

Embodiment 15. A composition comprising a dielectric substrate and at least one layer of oriented perovskite, perovskite-type, or perovskite-like material superposed thereon.

Embodiment 16. The composition of Embodiment 15, further comprising a metallic layer, wherein the metallic layer is sandwiched between the dielectric substrate and the at least one layer of oriented perovskite, perovskite-type, or perovskite-like material.

Embodiment 17. The composition of Embodiment 15 or 16, further comprising a MXene layer, wherein a MXene layer is sandwiched between the dielectric substrate and the at least one layer of oriented perovskite, perovskite-type, or perovskite-like material.

Embodiment 18. The composition of any one of Embodiments 15 to 17, further comprising a MXene layer, wherein a MXene layer is sandwiched between the metallic layer and the at least one layer of oriented perovskite, perovskite-type, or perovskite-like material.

Embodiment 19. The composition of any one of Embodiments 15 to 18, wherein the dielectric substrate has an average surface roughness of less than about 10 nm.

Embodiment 20. The composition of any one of Embodiments 15 to 19, wherein the at least one layer of oriented perovskite, perovskite-type, or perovskite-like material has a thickness in a range of from 1 to 1000 nm, including for example from 2 to 50 nanometers.

EXAMPLES

The Examples described in the appended Attachments are provided to illustrate some of the concepts described within this disclosure. While each Example is considered to provide specific individual embodiments of composition, methods of preparation and use, none of the Examples should be considered to limit the more general embodiments described herein.

Example 1. Methods

Example 1.1. MXene preparation. The $Ti_3AlC_2$ MAX phase was synthesized as follows. To obtain large MXene flakes, chemical exfoliation of $Ti_3AlC_2$ was accomplished by means of a HCl—$H_2O$—HF solution (6:3:1). One gram of $Ti_3AlC_2$ powder (particle size<38 μm) and 40 mL of etchant solution was stirred at 500 RPM for 24 h at room temperature. Delamination of $Ti_3C_2T_x$ was completed by the slow addition of 4 g of LiCl, to avoid overheating, and subsequent mixing. Deionized water (ca. 150 mL) was added. The mixture was centrifuged at 3500 RPM for 2 min, and the supernatant was decanted. This process was repeated until a dark supernatant formed. The dark supernatant was centrifuged for 10 min to remove the remaining unetched MAX phase and the $Ti_3C_2T_x$. After separating the unetched MAX phase material in the sediment, the solution was centrifuged at 3500 rpm for 1 h, and 30 mL of deionized (DI) water was added to the sediment centrifuged for five minutes. In some experiments, the supernatant dispersion of delaminated d-$Ti_3C_2T_x$ with a concentration around 0.5 mg/mL was used in subsequent spray-coating. In other experiments, the supernatant used for this purpose had a concentration of about 3 mg/mL. To prepare d-$Ti_3C_2T_x$ solution with small MXene flakes, $Ti_3AlC_2$ MAX phase was etched in a mixture of LiF and HCl etchant. Briefly, 2 g of $Ti_3AlC_2$ powder was added to a pre-mixed solution of 2 g of LiF and 20 mL of 9 M HCl. The reaction mixture was stirred at 35° C. for 24 h. Then the reaction mixture was washed with 9 M HCl for 3 cycles, followed by DI water for 3 cycles. The $Ti_3C_2T_x$ solution was filtered on a polypropylene membrane (3501 Coated PP, Celgard, USA). 200 mg of finely ground powder was dispersed in 20 mL of DI water. The suspension was sonicated by a probe sonicator (FB-505, Fisher Scientific, USA) operating at 25 kHz for 30 min. The suspension was centrifuged at 3500 rpm for 1 h to collect the d-$Ti_3C_2T_x$ dispersion in the supernatant.

A 5×5 mm quartz substrate was treated with $H_2SO_4$:$H_2O_2$ (3:1) solution (Piranha solution) for 1 h under sonication to yield a hydrophilic surface. The treated substrate was sonicated in DI water then acetone for 15 and 10 min, respectively. The d-$Ti_3C_2T_x$ solution was sprayed onto the substrate by airbrush (Master Airbrush Model G-233, USA) with a 0.2 mm nozzle size and 80 psi operating pressure. After deposition of each layer, the sample was dried with an air gun (Master heater gun Model HG-201A, USA). A dip-coater (PTL-MM01, MTI Corporation, USA) was used for dip-coating. A pre-cleaned substrate was dipped in the d-$Ti_3C_2T_x$ solution for 10 min and pull up with a constant speed of 200 mm/minute. The coated film was allowed to dry in air for about 10 min. The film was further heated at 150° C. in a vacuum oven for 3 h to remove interacted water molecules between the $Ti_3C_2T_x$ layers.

Example 1.2.1 $BaTiO_3$ Thin Film Deposition Using PLD. Several BTO films were deposited onto quartz/$Ti_3C_2T_x$ substrates by means of pulsed-laser deposition. The thin film depositions were conducted using commercially available polycrystalline stoichiometric ceramic targets (BTO: from Kurt J. Lesker) with a KrF excimer laser (Lamdba-Physik COMPLEX 102, λ=248 nm) at a base chamber vacuum pressure of less than 2.0×10$^{-6}$ Torr. Growths of the BTO films were carried out using a laser fluence of 1.30 J/cm², at a 3 Hz repetition rate and a temperature of 700° C. and an oxygen pressure of 20 mTorr. Deposition for 100 minutes provided BTO films of about 90 nm. The films were post-growth annealed in the growth chamber (to minimize oxygen vacancy formation) for 10 min at the deposition temperature under 500 Torr of oxygen, cooled from 700° C. to 200° C. at 10° C./min and then finally to room temperature at a slower rate of 5° C./min.

Example 1.2.2 $BaTiO_3$ Thin Film Deposition Using ALD. Atomic layer depositions of the Ba—Ti—O thin films were carried out in a Picosun R200 Advanced Reactor on the quartz/$Ti_3C_2$, Si(100)/$SiO_2$/Ti/Pt(111)/$Ti_3C_2$ substrates (Gmek Inc.), and on free-standing MXene films. 6N purity $N_2$ gas was used as carrier gas and Absolut Ba (Air Liquide, Ba(iPr₃Cp)₂), titanium(IV)-methoxide (Alfa Aesar 95%, Ti(OMe₃)₄), and deionized $H_2O$ served as precursors for Ba, Ti, and O, respectively. The source cylinders for Ba(iPr₃Cp)₂ and Ti(OMe₃)₄ were kept at 200° C., while the water source was kept at room temperature. The deposition chamber temperature was 290° C. For the Ba—O subcycle the pulse and purge times were 1.6/6 s for Ba(iPr₃Cp)₂ and 0.1/10 s for $H_2O$. For the Ti—O subcycle the pulse and purge times were 0.3/2 s for Ti(OMe₃)₄ and ⅓ s for $H_2O$, respectively. In order to achieve a stoichiometric cation ratio a sequence of {3×[3×(Ba—O)+1×(Ti—O)]+50×[2×(Ba—O)+1×(Ti—O)]} was repeated 6 times resulting in a Ba—Ti—O film thickness of ~110 nm.

Example 1.3. $Al_2O_3$ Thin Film Deposition. Atomic layer deposition of the $Al_2O_3$ layers was conducted in a Picosun R200 Advanced reactor using trimethyl-aluminum (Alfa Aesar) and $H_2O$ as reactants at a deposition temperature of 290° C.

Example 1.4. X-ray diffraction, Atomic Force Microscopy, Piezoresponse Force Microscopy, Transmission Electron Microscopy. Film orientation and thickness were confirmed by XRD and XRR (Rigaku SmartLab) respectively using a Cu Kα source. In-plane and out-of-plane scans were performed to determine the orientation of the BTO films and the presence of the MXene before and after the thin film deposition. The pole figure was completed using the in-plane method on the same diffractometer. Topographic height atomic force microscopy was used to determine the quality of the MXene and the deposited film surface (Bruker Icon). Dual AC resonance tracking PFM (Asylum MFP-3D) was used to scan the BTO film over a 5 μm×5 μm area with a scan speed of 1 Hz. A 6 V DC and a 4 V AC voltage was applied to the tip for the scans. The tip (Ti/Pt coated silicon with a 28+/−10 nm radius, Oxford Instruments-Model number AC240TM-R3) had a central frequency of 330 kHz and a quality factor of 153.4 in contact resonance. SS-PFM was conducted using the same conditions as above. The cross-section of the Pt/MXene/BTO/$Al_2O_3$/Pt structure for TEM was prepared using a FEI Strata Dual Beam Focused Ion Beam—Scanning Electron Microscope equipped with an Omniprobe micromanipulator. A standard lift-out procedure was used. TEM and STEM-EDS experiments were performed on a JEOL JEM2100 operated at 200 keV.

Example 1.5. Electrical properties measurements. Platinum top electrodes of thickness 120 nm were deposited onto the BTO films using DC magnetron sputtering with photolithographically defined electrodes of nominally 90×90 μm². Current vs voltage, capacitance vs voltage, and capacitance vs frequency measurements were collected on film samples placed in a probe station (Lakeshore Cryotronics TTP4) using an electrometer (Keithley SCS-4200) using a MIM (top-bottom) configuration. To determine the dielectric constant of only the BTO layer in the films with BTO/$Al_2O_3$ bilayer, two parallel plate capacitors in series were assumed and the dielectric constant was extracted from the total measured capacitance, using a dielectric constant of 10 for $Al_2O_3$ and the corresponding layer thicknesses of 3 and 100 nm for $Al_2O_3$ and BTO, respectively.

Example 2. X-ray Diffraction.

Figure 2A:
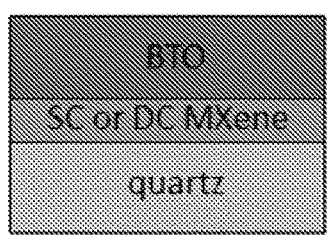
FIGS. 2(A-C) provide schematic representations showcasing the different film stacks. The structure in FIG. 2(A) was utilized twice with either the spray-coating (SC) or dip-coating (DC) method with a thickness of 5 nm or 40 nm of $Ti_3C_2$ MXene, followed by 100 nm of $BaTiO_3$ (BTO).
FIG. 2(B) reflects an embodiment where 5 nm of the MXene was deposited by SC on a Pt-silicon wafer, followed by 100 nm of BTO, then 3 nm of $Al_2O_3$, and finally 90 nm of Pt for the top electrodes.
FIG. 2(C) reflects an embodiment where 100 nm of BTO was deposited on a Pt-silicon wafer, followed by 3 nm of $Al_2O_3$, and finally 120 nm of Pt for the top electrodes.
Figure 2B:
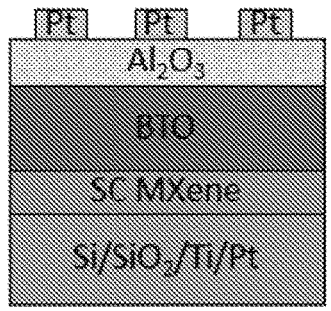
Figure 2C:
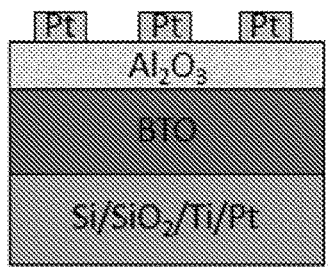
Figure 2D:
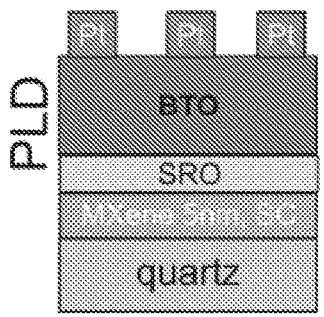
Figure 2E:
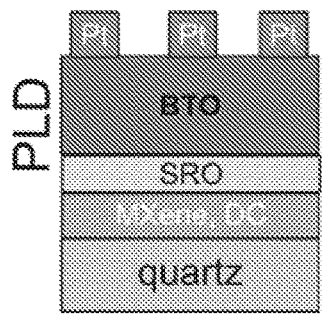
Figure 2F:
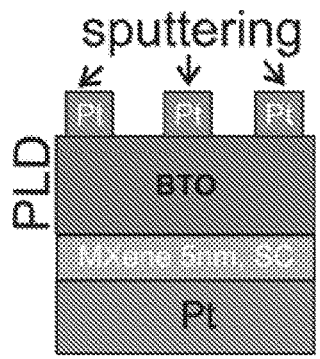

Example 2.1—Samples Derived from Direct Deposition to MXene. The MXene films were synthesized as described elsewhere herein and deposited on the surface of quartz substrates and commercially available Pt (111)/Ti/$SiO_2$/Si (001) wafers (Pt-silicon). Two methods, spray-coating and dip-coating, were used to deposit the MXene solution onto the substrates. The average lateral size of MXene flakes utilized for the spray-coating method was about 5 μm, while for the dip-coating method the average flake size was about 1 μm. A set of various thin film stacks were synthesized to examine the effects of the MXene layers on the BTO film. For the deposition sequence outlined in FIG. 2(A), spray-coated MXene layers with thicknesses of about 5 nm or 40 nm were used. In both cases, BTO was deposited onto the quartz/MXene heterostructure by PLD. For another set of samples, shown in FIG. 2(B), MXene was spray coated on the surface of Pt-silicon (after treating the surface with Piranha acid solution to make it hydrophilic) followed by a subsequent growth of BTO by PLD. For comparison, a BTO thin film of the same thickness was directly grown on a Pt-silicon substrate without the MXene seed layer under the same conditions (compare FIGS. 2(B) and (C)). Both of these films had a layer of 3-nm-thick of $Al_2O_3$ deposited by atomic layer deposition (ALD) in a separate step followed by sputtering of platinum top electrodes to produce MIM-capacitors.

Figure 3A:
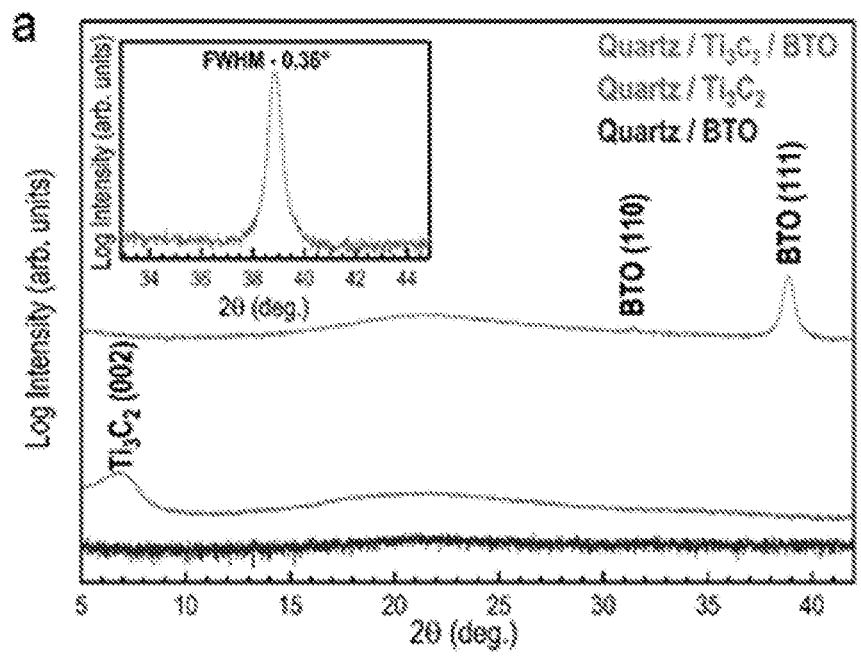
FIG. 3(A) shows XRD of BTO films (~100 nm) grown on quartz with and without MXene layer (40 nm). The inset of FIG. 3(A) shows the rocking curve of the BTO (111) peak on quartz with spray-coated MXene.
Figure 3B:
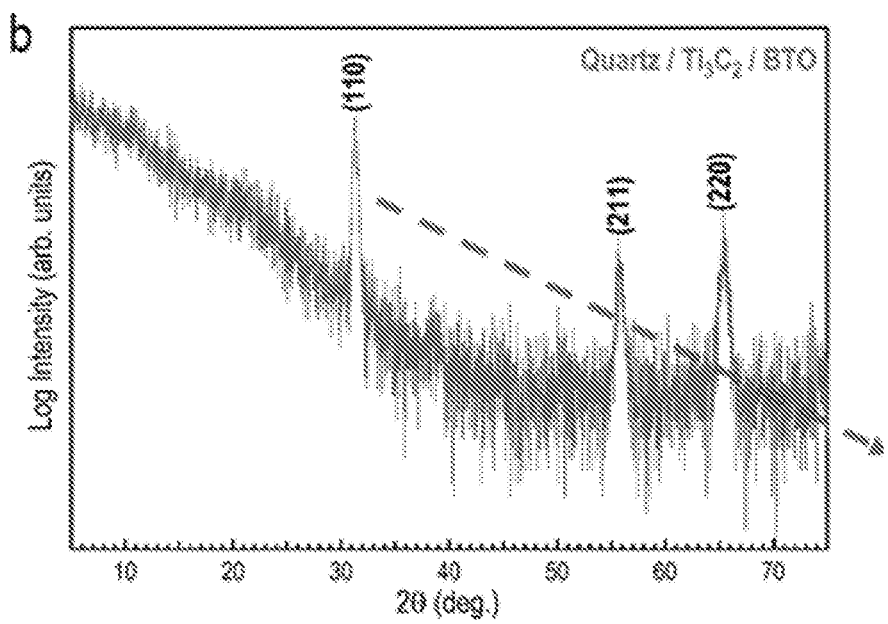
FIG. 3(B) shows in-plane grazing incident scan of BTO on quartz with spray-coated MXene (40 nm).
Figure 3C:
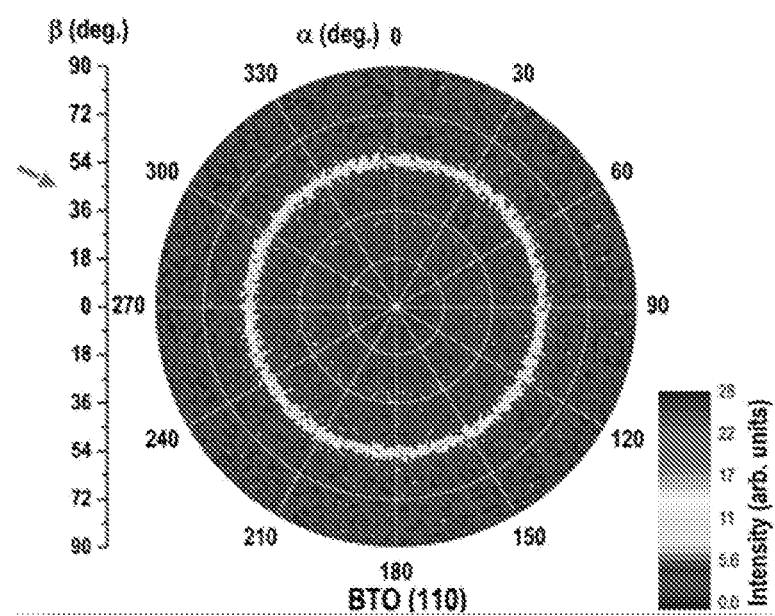
FIG. 3(C) shows in-plane pole figure on the sample shown in FIG. 3(B) around the BTO (110) reflection.
Figure 3D:
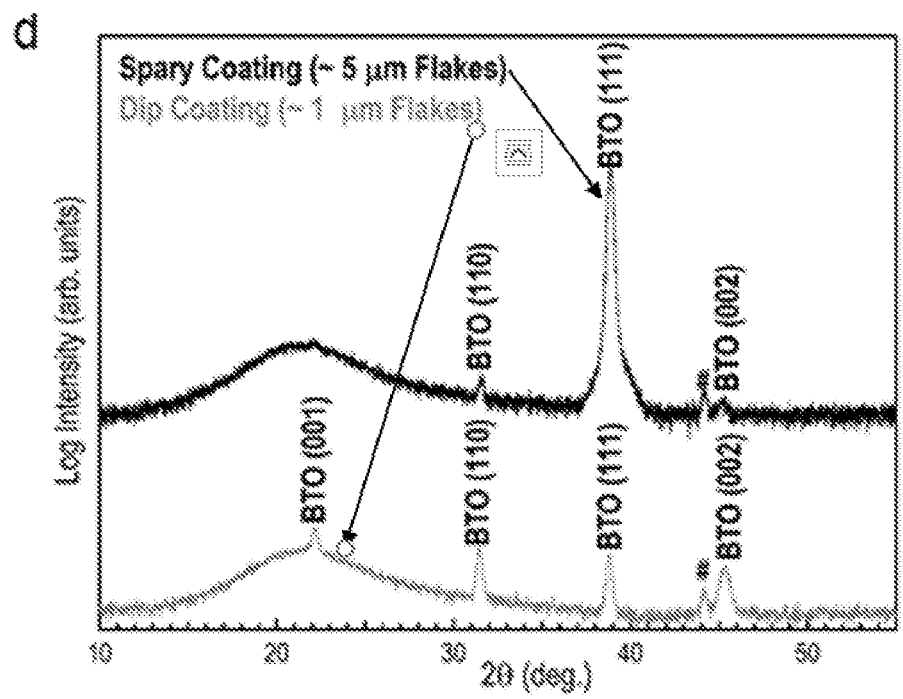
FIG. 3(D) shows XRD of BTO films grown on quartz with spray-coating and dip-coating methods.

The X-ray diffraction (XRD) scan of the MXene on quartz revealed a peak at ~7°, corresponding to the (002) Bragg-peak of the MXene layers, which corresponds to a c-lattice parameter of 22 Å, indicating the presence of residual water between the $Ti_3C_2$ layers. In addition, a broad peak located at ~21.5° (middle trace in FIG. 3(A)) corresponding to the amorphous quartz substrate, which is apparent in all the other traces in FIG. 3(A). After the high temperature BTO deposition this peak vanished, suggesting that the MXene layer decomposed during the BTO deposition resulting from the low stability of $Ti_3C_2$ in air at high temperatures. However, comparing the XRD pattern for the BTO growth on quartz with and without the MXene layer (top and bottom traces in FIG. 3(A), respectively), two key results became apparent: i) the presence of the MXene layer initiated the crystallization of BTO on an amorphous substrate at a growth temperature of 700° C., which otherwise resulted in an amorphous film as evident from the lack of any diffraction peaks for BTO grown directly on quartz, and ii) the addition of the MXene layer promoted highly-oriented growth along the (111) direction, despite the degradation of the MXene during the BTO deposition (FIG. 3(A)). This observation was in contrast to a similar study for graphene/$SrTiO_3$, where the hexagonal graphene layer promoted (001)-orientation (see, e.g., Lee, S. A., et al., "Highly Oriented $SrTiO_3$ Thin Film on Graphene Substrate. *ACS Appl. Mater. Interfaces* 2017, 9 (4), 3246-3250). The inset of FIG. 3(A) shows the rocking curve of the (111) BTO peak, which revealed the oriented growth along this direction. The corresponding grazing incidence in-plane XRD scan (FIG. 3(B)) had diffraction maxima exclusively belonging to planes, which are orthogonal to the (111) planes, confirming the BTO film's high degree of orientation. At the same time, the occurrence of various peaks that fulfilled the condition of orthogonality implied a polycrystalline nature within the plane of the BTO-film. Due to the lack of any peak splitting, the data were analyzed by assuming a cubic symmetry in all cases and the calculated lattice parameters are summarized in Table 1. The slight disagreement between the in-plane and out-of-plane a-lattice constant was mostly likely caused by the difference in the experimental setup; however, the difference suggested a slightly strained growth initiated by the templating effect of $Ti_3C_2$. Comparing the a-lattice constant of the BTO film to literature showed that the a-lattice constants of these films compared very well with unstrained films. (compare, e.g., Wang, J. J., et al., "Lattice, Elastic, Polarization, and Electrostrictive Properties of $BaTiO_3$ from First-Principles," *J. Appl. Phys.* 2010, 108 (3)). An in-plane pole figure (FIG. 3(C)), on the sample from FIG. 3(B), around the BTO (110) peak showed that the film was textured. The ring shape from the pole figure indicated that the (110) planes of BTO lacked a preferred in-plane orientation, which was a result of the BTO film templating from the random orientation of the MXene flakes. Interestingly, the initial lateral size of the $Ti_3C_2$ flakes used for the MXene layer also determined the degree of preferred (111) orientation of the BTO film (FIG. 3(D)). This was showcased by the use of smaller lateral sized MXene flakes for the dip coating method, which significantly reduced the preferred growth orientation along the (111) direction and the deposited BTO film had a more random grain distribution. To quantify the preference of the BTO films to grow along the (111) orientation, the ratio ($I_{111}/I_{110}$) of the integral intensities of the (111) to (110) peaks were determined for both, the spray- and dip-coated MXene/BTO samples. For the spray-coated sample, $I_{111}/I_{110}$ was above 31,000 compared to randomly oriented powder, which had an intensity ratio of 0.24. For the dip coated sample with a layer of smaller MXene flakes, the $I_{111}/I_{110}$ dropped to about 1, which implied a strongly reduced preference for the (111) orientation. In turn, this observation suggested a level of control for the fraction of (111) oriented BTO grains in the films over other crystallographic directions by controlling the size of the MXene flakes. In both cases, the deposition conditions described herein produced (111) and (110) oriented films, which differ significantly from randomly oriented powder. Finally, it was also important to note that for both, the spray—and dip-coated MXene/BTO samples, the BTO deposition caused the complete decomposition of $Ti_3C_2$, which is evident from the lack of a MXene peak around 7°.

Figure 3E:
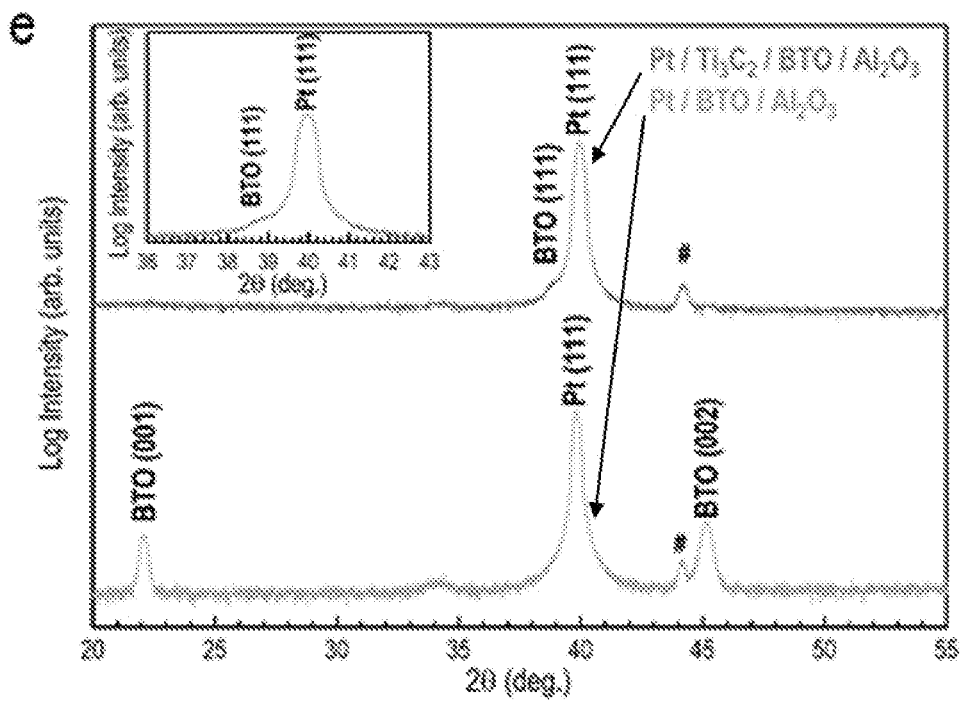
FIG. 3(E) shows XRD of films grown on Pt with and without MXene layer. The inset of FIG. 3(E) shows the region around the BTO (111) and the Pt (111) peaks. The # denotes a peak from the sample stage.

Another set of samples was fabricated on Pt-silicon using larger laterally sized (5 μm) MXene flakes applied through the spray-coating method to probe the influence of the $Ti_3C_2$ seed layer on the resulting properties. For this purpose, a reference BTO sample was grown directly on Pt-silicon without the MXene layer (see FIGS. 2(B) and (C)). In both cases, an amorphous capping layer of 3-nm-thick of $Al_2O_3$ was deposited by ALD after the PLD-growth of BTO to inhibit leakage current through pinholes in the films. The XRD patterns of these films are depicted in FIG. 3(E). While the BTO film directly grown on Pt-silicon only showed (001) peaks (FIG. 3(E)), it has been reported in literature that the resultant film orientation from the non-equilibrium PLD growth process is strongly dependent on the deposition conditions. Silva et al. ("Influence of Laser Repetition Rate on Ferroelectric Properties of Pulsed Laser Deposited $BaTiO_3$ Films on Platinized Silicon Substrate," *Appl. Phys. A Mater. Sci. Process.* 2013, 113 (2), 379-384) showed that for a higher repetition rate, the (100) BTO peak was suppressed and the (110) and the (111) peaks were enhanced. While the (001) and the (111) peaks of BTO were present at all temperatures in the XRD patterns, the (110) peak was affected by the substrate temperature with the (110) peak intensity declining as the substrate temperature decreases until it vanishes at a temperature of 450° C. As in the present study the deposition conditions remained unchanged, comparison of the two films grown on Pt-silicon implied that the MXene layer was able to completely change the preferred orientation of resulting films from the (001) to the (111) direction, similar to the observed effect on the quartz substrate. From the calculated lattice parameter, both films had an a-lattice constant of 4.01 Å, which is close to the bulk value from powder diffraction indicating that the deposited BTO films have no in-plane strain imparted by the substrate. From these results, it was clear that the MXene flakes induced a preferred growth in the (111) direction of the BTO film, despite the decomposition of the MXene film. This templating effect is thus hypothesized to provide very similar to the growth of e.g. (001) oriented $SrTiO_3$ (STO) on (001) oriented Si, where the initial growth of the oxide on Si defines the orientation and a subsequent formation of $SiO_x$ at Si/STO interface during the continuous growth of STO under oxidizing conditions causes no interruption in the growth orientation. Therefore, it is concluded that the stability of the MXene flakes is a decisive factor for initiating the growth of the BTO film in the (111) direction. This conclusion is supported by the aforementioned results for differently sized MXene flakes, which alter the growth direction of the oxide film with a reduced (111) preference for smaller sizes. Interestingly, independent of the flake size, the crystallization of BTO was strongly promoted as opposed to the deposition directly on quartz resulting in an amorphous film.

TABLE 1

Calculated cubic α-lattice parameters of the grown BTO films on different substrates, and the XRD measurement

| Sample | Measurement | α-lattice constant (Å) |
|---|---|---|
| Quartz/MXene/BTO | Grazing Incidence | 4.03 ± 0.01 |
|  | Out-of-plane | 4.01 ± 0.01 |
| Pt/BTO | Out-of-plane | 4.01 ± 0.01 |
| Pt/MXene/BTO | Out-of-plane | 4.01 ± 0.01 |

Figure 3F:
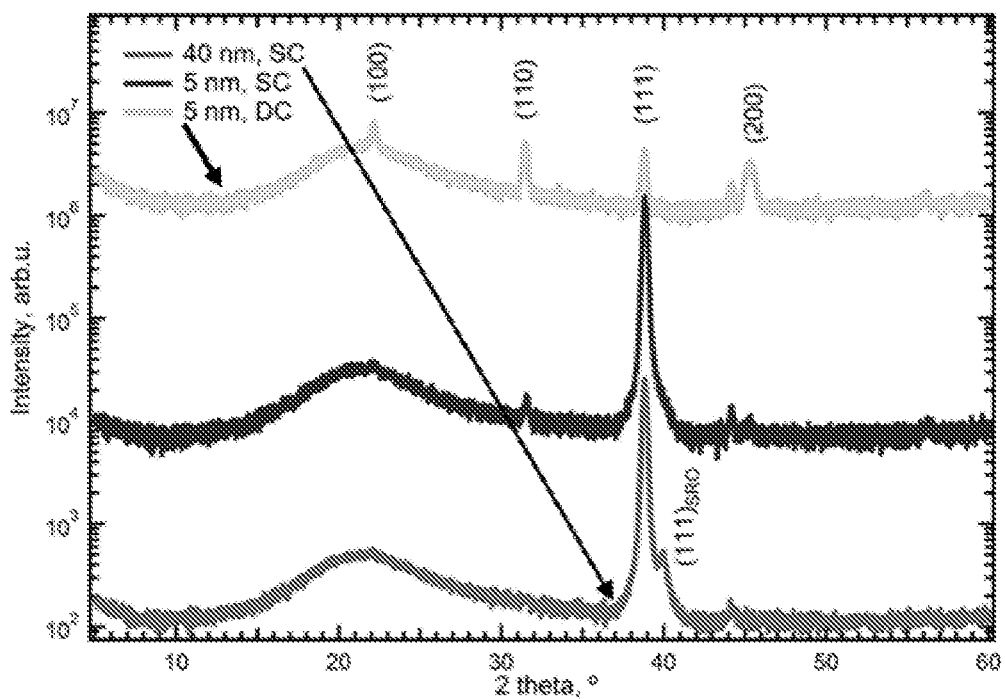
FIG. 3(F) shows XRD patterns as a function of MXene thickness for barium titanate grown in $SrRuO_3$ interlayer (see Example 2.2) FIG. 3(G) compares the XRD patterns for (i) 5 nm MXene $Ti_3C_2$ film (bottom trace), (ii) 23 nm barium titanate films deposited by PLD at 700° C., low $O_2$ pressure on the MXene $Ti_3C_2$ film (top trace) and (iii) 23 nm barium titanate films deposited by PLD at 700° C., low $O_2$ pressure directly in Si/SiO$_2$ (middle trace).
Figure 3G:
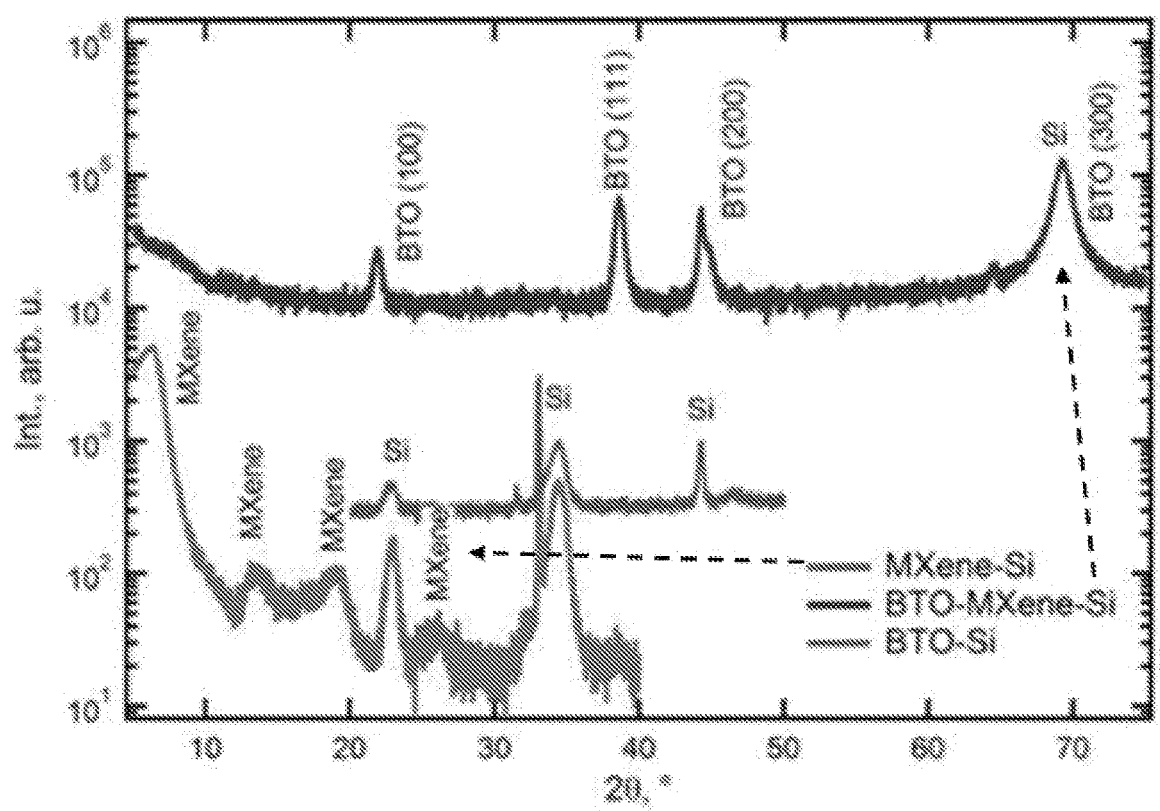

Example 2.2. Samples with SRO Intermediary Layers. Following the depositions of the of $SrRuO_3/BaTiO_3$ (SRO/BTO) films on top of the quartz/MXene (as illustrated in FIGS. 2(D-F)), X-ray diffraction (XRD) was completed on the four samples which is shown in FIG. 3(F). The XRD scan of the quartz substrate with $Ti_3C_2$ MXene revealed one broad peak located about 21.5° corresponding to the amorphous quartz substrate that is also apparent in all other XRD scans. The peak that appeared at about 8° corresponds to the MXene layers with c-lattice parameter of about 22 Å, a typical value of an annealed MXene film. Several traces corresponded to the growth of SRO/BTO films on top of the quartz/MXene, as a functions of MX-ene thickness. Again, it can be seen that the effect of MXene thickness had a critical role in the formation of the orientated SRO/BTO film. The 40-nm-thick starting $Ti_3C_2$ MXene provides a higher degree of orientation of the pseudo-cubic (111)SRO/(111) BTO films as compared to the 5-nm-thick MXene sample which had additional peaks corresponding to (100) and (110) Bragg-peaks of BTO. When comparing the SC and DC methods, the smaller flake size of the MXene used in the DC further reduced the preferred growth orientation along the [111] direction and the deposited films were polycrystalline. It also should be noted that the MXene peak that should appear at 8° was no longer present suggesting that the MXene layer was removed during the deposition, but provided a seed layer to promote oriented growth. Compared to the growth of BTO on plain quartz substrates, it was clear that the MXene layers promote crystallization of the perovskite phase.

Figure 4A:
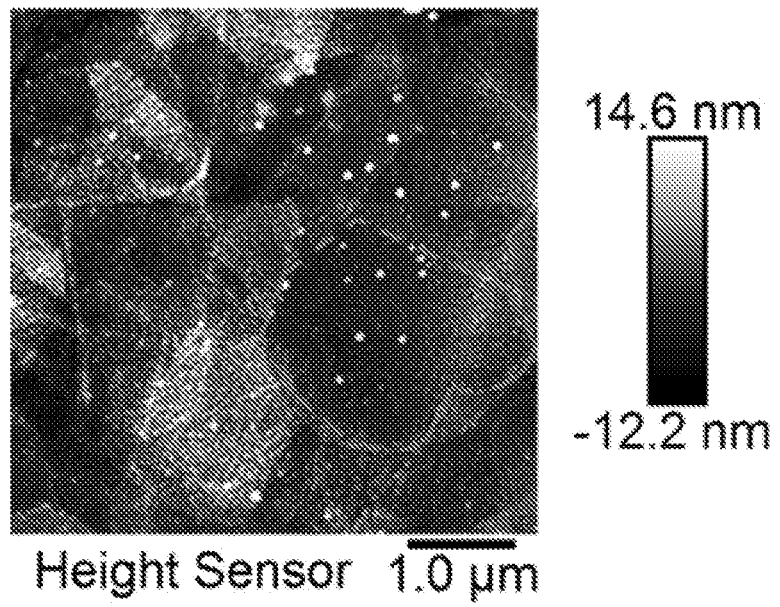
FIG. 4(A-B) shows AFM images showing the surface morphology of the BTO films grown on quartz substrates with 5-nm-thick MXene layers, the results for a spray-coating method with an average flake size of 5 μm (FIG. 4(A)), and dip-coating method with an average flake size of 1 μm (FIG. 4(B)). the dashed outlines highlight representative BTO grains. Note: these two films have a 12-nm-layer of $SrRuO_3$ deposited between the substrate and the BTO film.
Figure 4B:
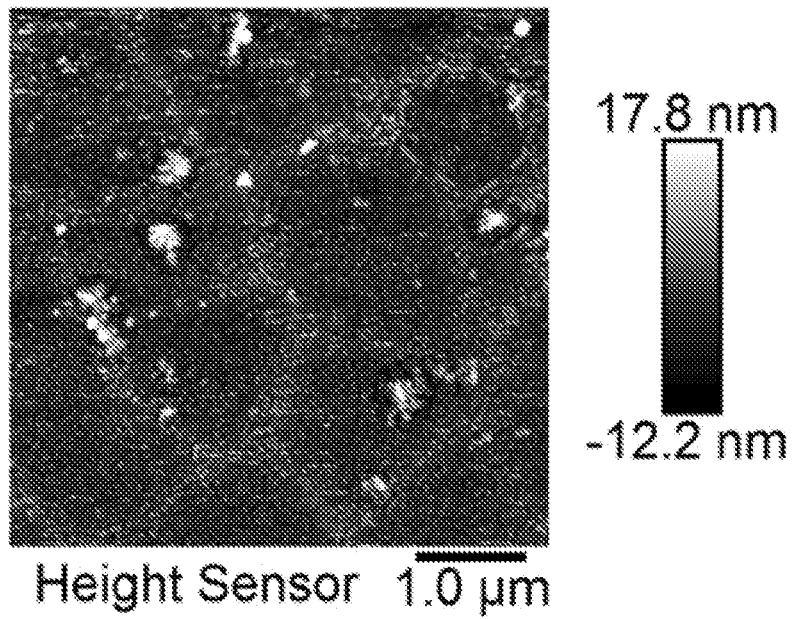

Example 3. Atomic Force Microscopy and Piezoelectric Force Microscopy. Atomic force microscopy (AFM) images were collected on the BTO films grown on the quartz substrates and are depicted in FIGS. 4(A-B). Interestingly, the resulting surfaces of the BTO films grown on the 5-nm-thick MXene layers showed that the BTO films have adopted a similar surface morphology as the MXene flakes. The morphology results from these samples were similar to those reported by others for hafnium oxide on glass substrates. Unlike the $HfO_2$ films, which were deposited by ALD at 160° C. using water as the oxygen source to minimize any potential degradation of the MXene, the BTO films were deposited at a temperature of 700° C. under partial oxygen pressure. As mentioned above, high temperature in the presence of oxygen significantly degraded the $Ti_3C_2$ MXene flakes, ultimately causing complete decomposition. While the MXene layer in these samples were certainly decomposed after the deposition, the BTO film not only adopted a preferred orientation, but also preserved the shape of the flakes for its own grains. From the AFM images (FIGS. 4(A-B)), it was clear that the in-plane grain size of the BTO film was governed by the initial size of the MXene flakes. This observation provided further evidence for the suggested templating effect occurring during the initial growth of BTO before the decomposition of $Ti_3C_2$.

Figure 5A:
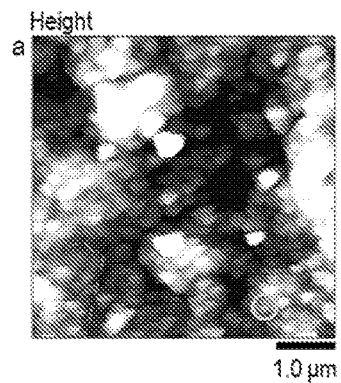
FIG. 5(A) illustrates the topography of a 5 μm×5 μm scan area, the dashed blue indicates the outline of the morphology of a BTO grain and the [light blue] circle indicates the point, where the pointwise SS-PFM was conducted.
Figure 5B:
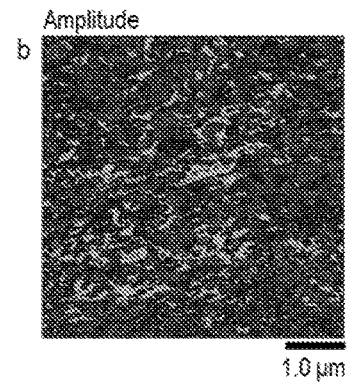
FIG. 5(B) and FIG. 5(C) show the amplitude and phase, respectively.
Figure 5C:
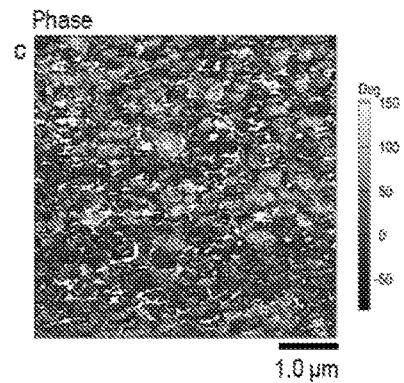
Figure 5D:
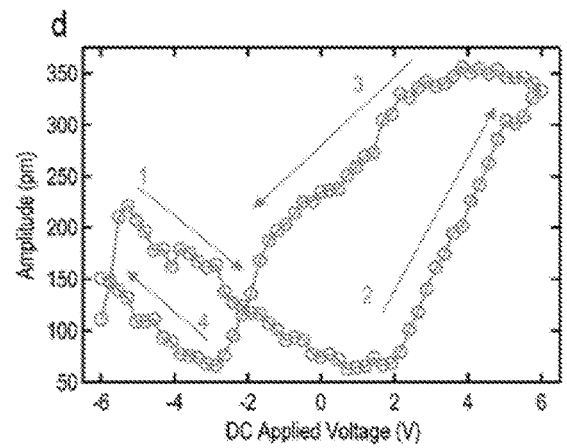
FIG. 5(D) and FIG. 5(E) show the phase and amplitude response of the SS-PFM, respectively.
Figure 5E:
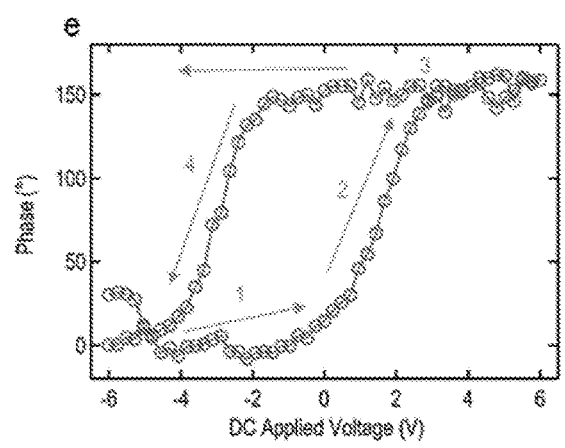

Piezoresponse force microscopy (PFM) scans and switching spectroscopy PFM (SS-PFM) were conducted on a BTO film that was grown on MXene spray coated Pt-silicon. The initial PFM scan showed a distinct difference in the amplitude and phase plots compared with the topology of the film (see FIGS. 5(A-C)) demonstrating that the deposited BTO film had a piezoelectric response with regions of ~180° phase difference over the 5 μm×5 μm area. Point-wise SS-PFM was conducted to determine the ferroelectric behavior of the BTO film and is provided for a representative location marked by the light blue circle in FIG. 5(A). The amplitude and phase results (FIGS. 5(D-E)) follow the same shape and pattern ("butterfly" loop) as other ferroelectric oxide films, confirming that despite the decomposition of the MXene under the deposition conditions, the ferroelectric properties of the BTO film were preserved.

Figure 6A:
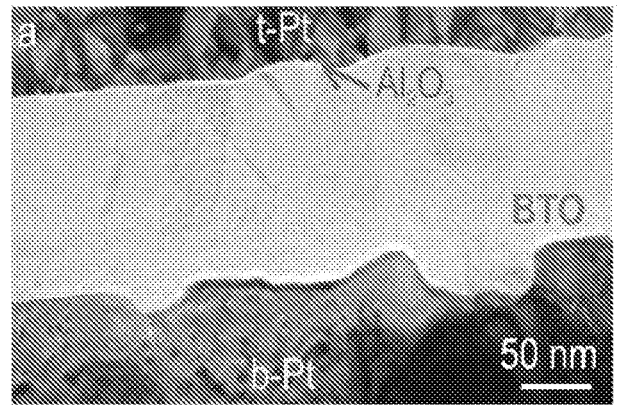
FIG. 6(A) shows a TEM image of the MIM-capacitor cross section outlined in FIG. 2(B).
Figure 6B:
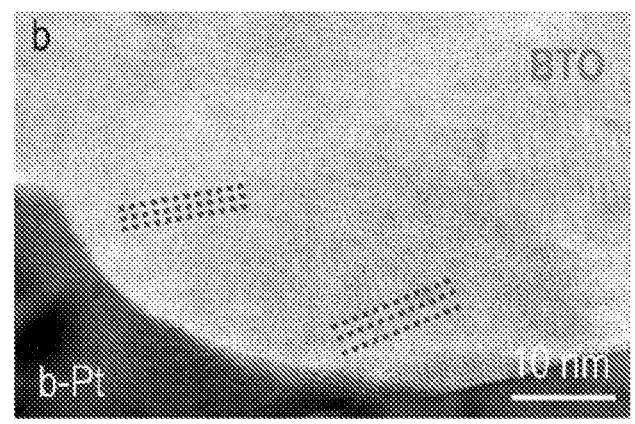
FIG. 6(B) shows the interface between the bottom Pt-electrode (b-Pt) and the BTO film, BTO grains with different orientations are highlighted.
Figure 6C:
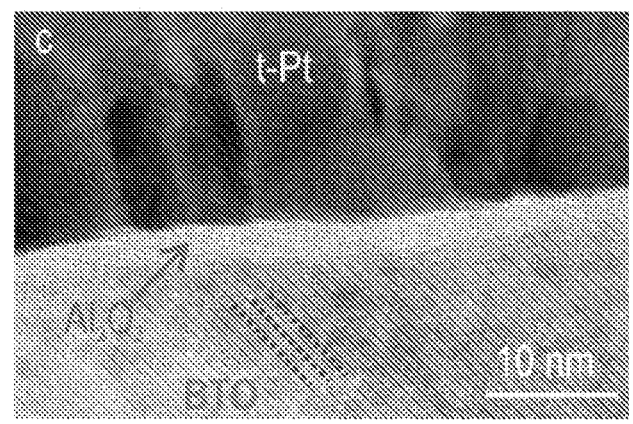
FIG. 6(C) shows the interface between the top Pt-electrode (t-Pt), the $Al_2O_3$ layer and the BTO film with atomic plane orientations highlighted by the dashed lines.

Example 4. Transmission Electron Microscopy. A transmission electron microscopy (TEM) cross-section of the MIM-capacitor structure (Pt-MXene-BTO—$Al_2O_3$—Pt) was investigated to examine the morphology of the BTO film and the interfaces of the electrodes. In FIG. 6(A), the Pt-electrodes were separated by ca. 100 nm of BTO. In addition, a thin bright layer on top of the BTO film indicated the presence of the ALD-grown $Al_2O_3$. In general, the morphology of the BTO film exhibited predominantly columnar grains extended perpendicular to the substrate surface corroborating the XRD results. The rough surface of the Pt bottom electrode resulted from the Piranha acid treatment (see Methods) prior to the MXene deposition. A closer inspection of the interface between the bottom electrode and the BTO film revealed that the atomic planes of BTO extended to the interface without any indication of the presence of MXene or any amorphous or Ti-rich phase (see FIG. 6(B)). This lack of impurities implied that the excess Ti was dissolved in the BTO film, while the carbon of the $Ti_3C_2$ layer outgased during the decomposition as $CO_x$ at 700° C. In FIG. 6(C) the interface with the top electrode is shown. The ca. 3-nm-thick ALD grown $Al_2O_3$ film was clearly amorphous, while a well-crystallized BTO film was present below.

Figure 7A:
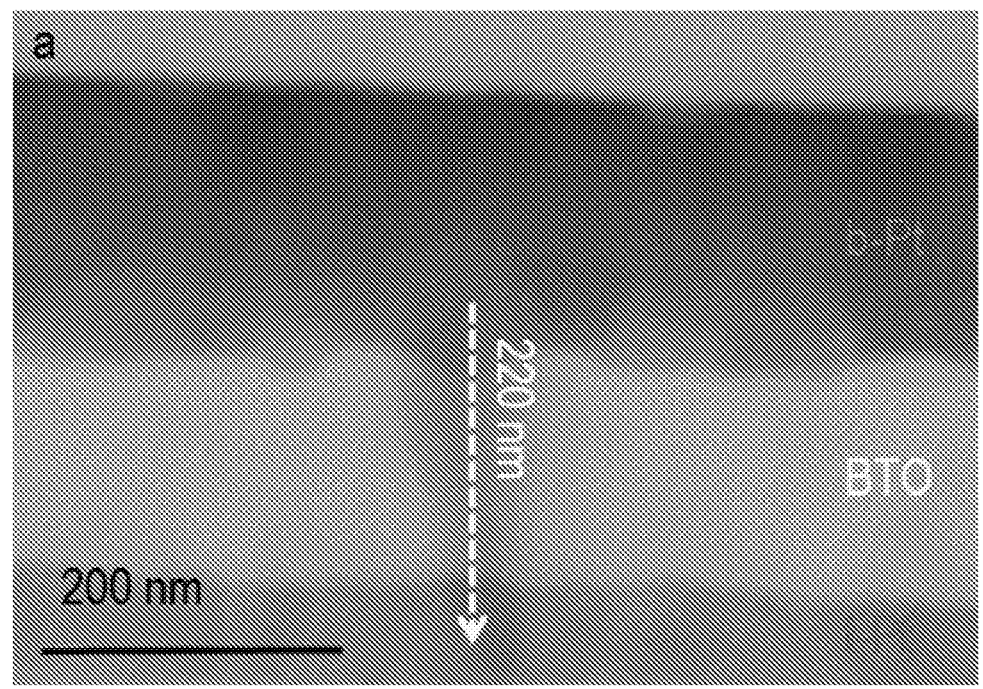
FIG. 7(A) shows a STEM image of the MIM-capacitor cross section outlined in FIG. 2(B) with the line scan for EDS highlighted by the dashed line. The arrow indicates the scan direction.
Figure 7B:
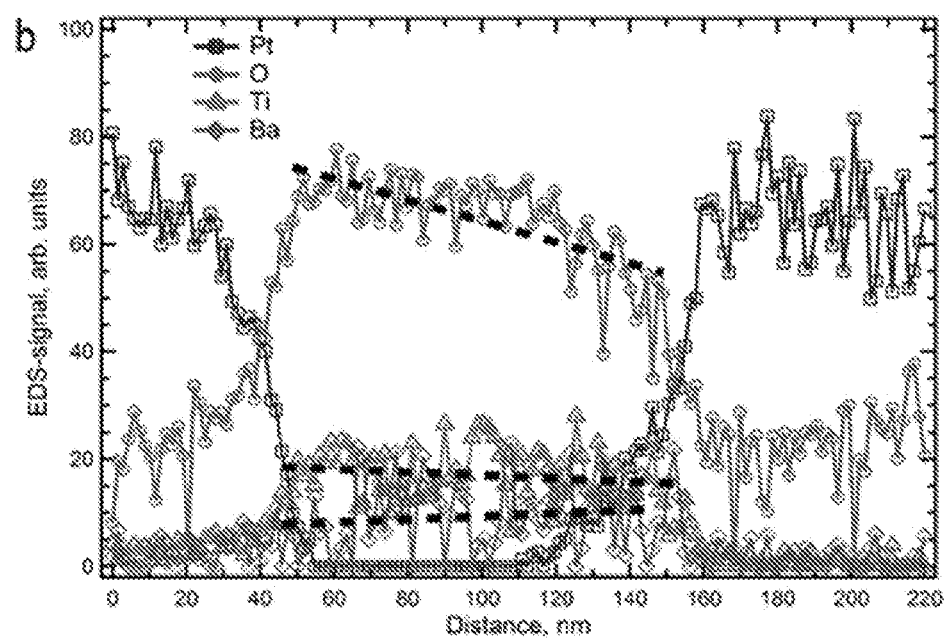
FIG. 7(B) shows an EDS-signal as a function of position along the line indicated in FIG. 7(A).

An energy dispersive spectroscopy (EDS)-line scan as presented in FIG. 7(B) on a scanning-TEM (STEM) image FIG. 7(A) indicated a minor change in composition of the BTO film from the bottom to the top electrode. While the Ti-content by trend decreased in the BTO film from the bottom to the top electrode, there was a slight increase of Ba. This change was consistent with a surplus of Ti from the decomposed 5-nm-thick $Ti_3C_2$ layer. Interestingly, the oxygen content decreased towards the top electrode, which could be related to the PLD-growth conditions, but could also be an artefact from the vicinity to the 3-nm-thick $Al_2O_3$ layer, which was not resolved during the EDS-line scan.

Figure 8A:
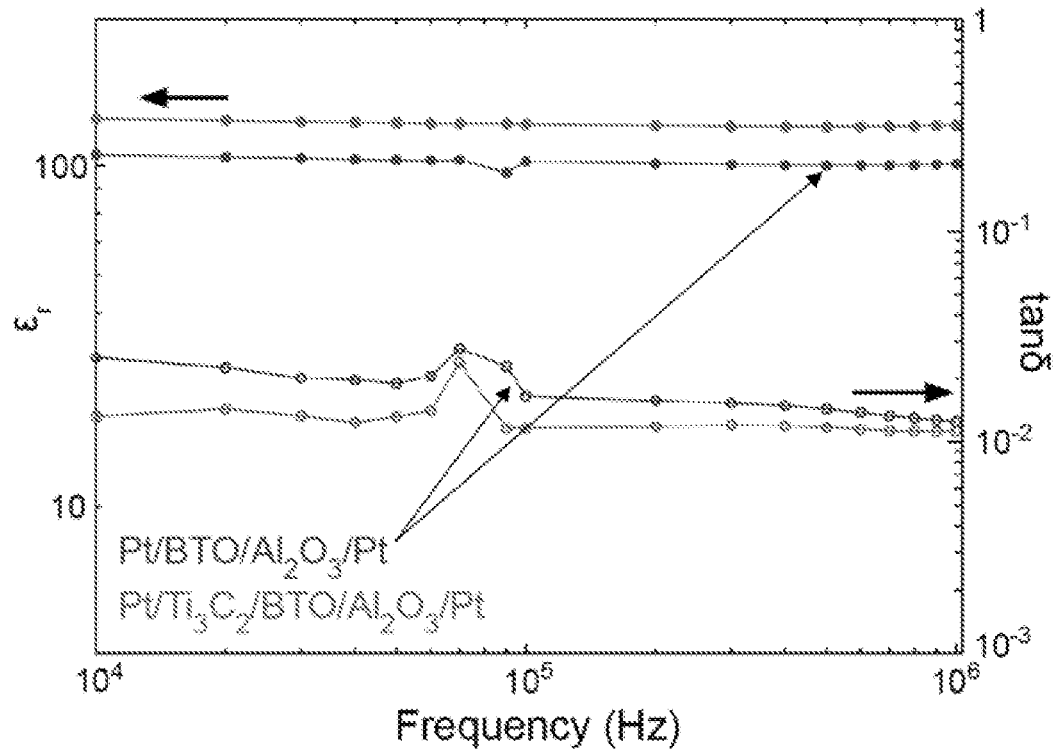
FIG. 8(A) shows the dielectric constant, $\varepsilon_r$, and loss tangent, tan δ, as a function of frequency at zero applied field.
Figure 8B:
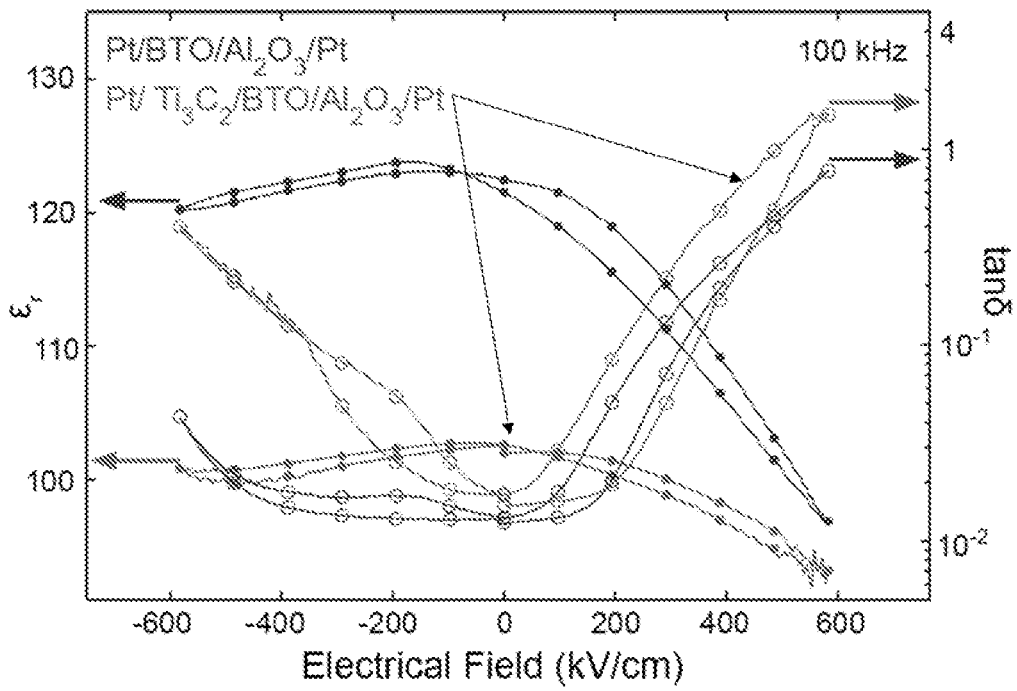
FIG. 8(B) shows a plot of dielectric constant and loss as a function of applied electric field collected at 100 kHz.

Example 5. Electrical Characterization. The thin ca. 3-nm-thick layer of $Al_2O_3$ was deposited to prevent leakage from pinholes and/or conduction paths in the films. The electrical properties in reference to a BTO film without MXene grown under identical PLD-conditions, were measured for the two MIM-structures outlined in FIGS. 2(B-C) and are displayed in FIGS. 8(A-B). The frequency dependence of the dielectric constant and the losses (FIG. 8(A)) revealed that there was little to no frequency dependence of the dielectric constant or the loss tangent in the measured range of 10 kHz to 1 MHz for both MIM structures. The very similar magnitude as well as frequency dependence of permittivity and dielectric losses in both films demonstrated that the dielectric properties did not deteriorate when a MXene seed layer was used. The electric field dependences of the dielectric constant and losses displayed in FIG. 8(B) showed in both cases a small asymmetry. The larger dielectric constant for the (001)-oriented film can be explained by the orientation of the $TiO_6$ octahedra with the applied field. Overall, these results demonstrate that the properties of the BTO layer were only marginally affected when utilizing a MXene layer as degradable crystallization template. Improvements in the deposition process such as the uniformity of the MXene layer (flake size, roughness) as well as adjustments to the PLD-growth (e.g. Ti-deficient target for the initial growth) are expected to translate into the dielectric performance.

Figure 9:
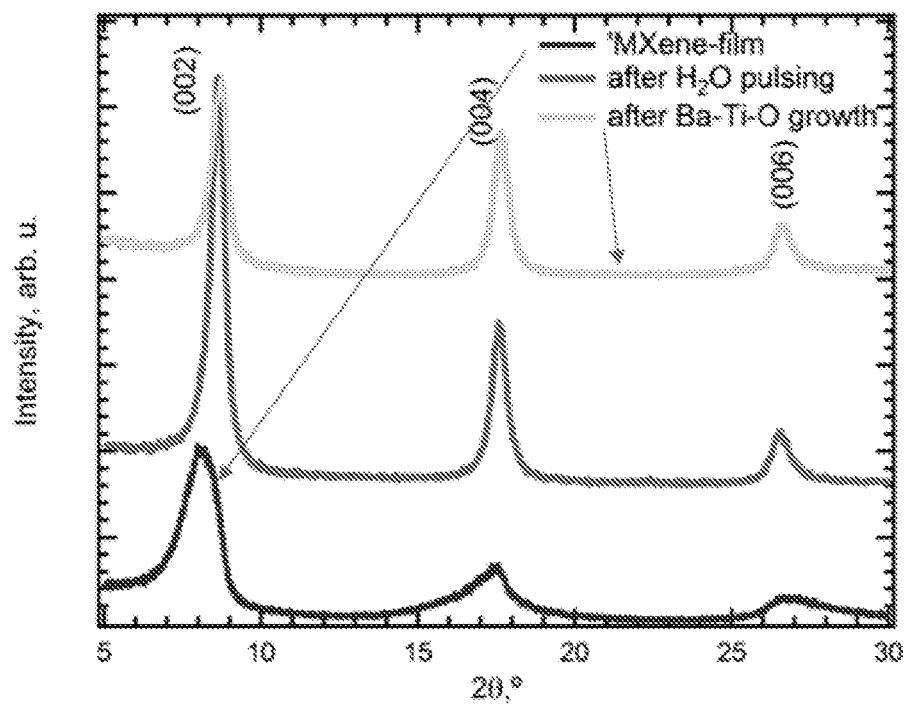
FIG. 9 shows X-ray diffraction patterns of a pristine MXene film and of parts of the same film exposed to $H_2O$ pulses at 375° C., and a Ba—Ti—O deposition at 290° C. All peaks can be indexed to (001) reflections of the highly oriented MXene flakes.

Example 6. Stability of MX-ene Films. To test the chemical and thermal stability of the MXene, free-standing $Ti_3C_2$ film with several microns thickness was exposed to $H_2O$ pulses at a reaction chamber temperature of 375° C. Another film with a similar thickness was exposed to the Ba—Ti—O deposition sequence using Absolut-Ba, Ti-methoxide and $H_2O$ as precursors at a temperature of 290° C. The X-ray diffraction (XRD) patterns of the films after these depositions are depicted together with a pristine MXene film in FIG. 9. Interestingly, the peaks corresponding to the (001) reflections of the MXene flakes become narrower implying a more uniform interlayer distance and increased preferred orientation of the c-direction perpendicular to the film surface. The average interlayer spacing decreases from c=2.07(1) nm to c=2.025(5) nm and c=2.016(5) nm for pristine, $H_2O$-pulsed, and Ba—Ti—O growth MXene films, respectively.

Figure 10:
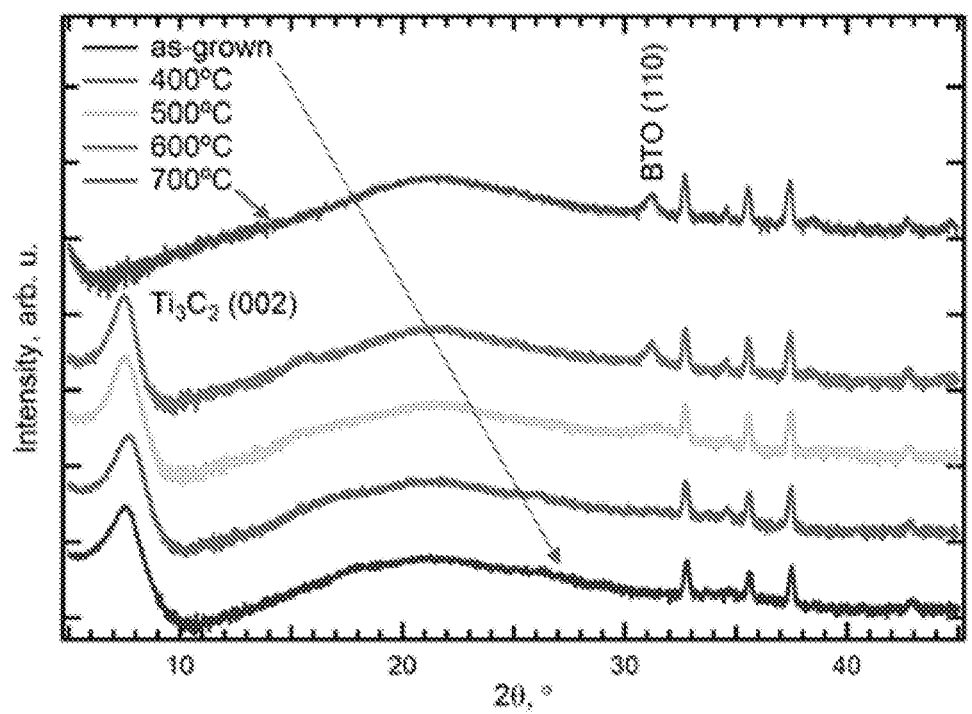
FIG. 10 shows an in-situ X-ray diffraction of a ~120 nm thick Ba—Ti—O film on a MXene (40 nm)/quartz substrate.
Figure 11:
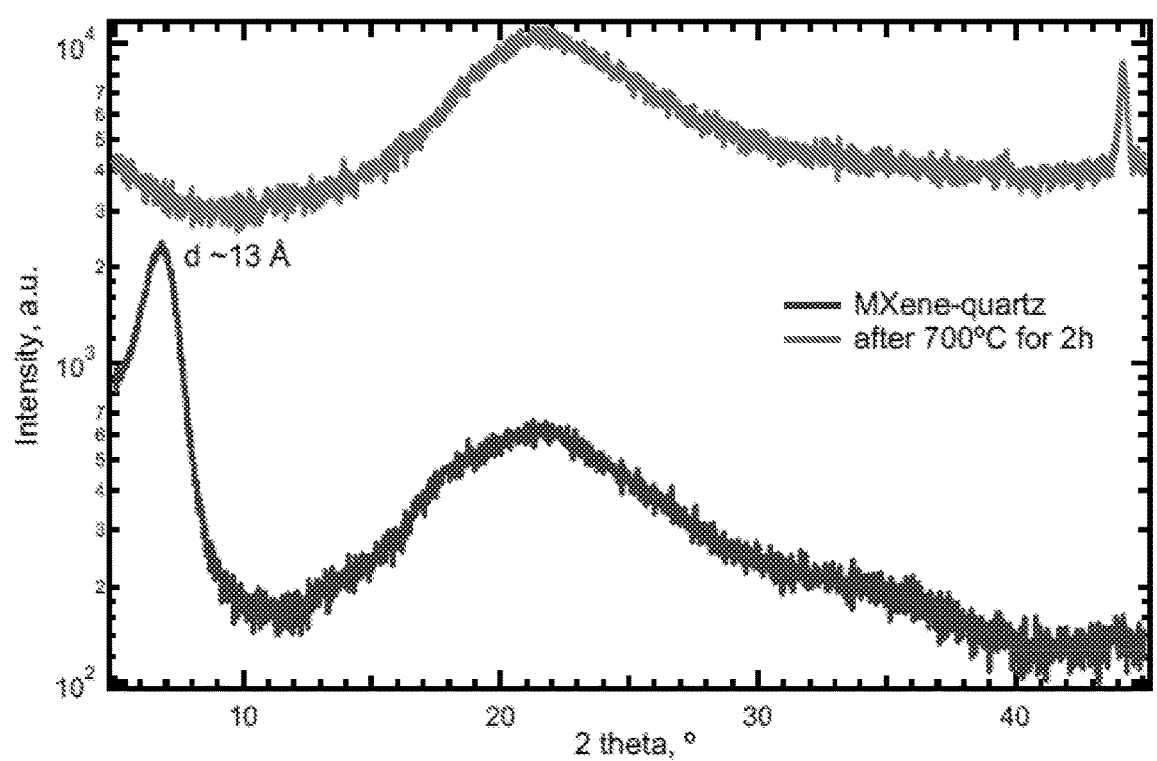
FIG. 11 shows XRD patterns of MXene film on quartz substrate as-prepared (lower trace) and after annealing at 700° C. for 2 hours (upper trace).

Subsequently, Ba—Ti—O films with a stoichiometric Ba/Ti-ratio were grown onto quartz substrates with a 40-nm-thick $Ti_3C_2$ film on top at 290° C. The presence of the (002)-peak of the MXene film was confirmed after the deposition and only a broad additional peak indicating weak crystallinity of the ALD-grown Ba—Ti—O film at ~27° in 2θ is observed (FIG. 10). Upon annealing in low vacuum polycrystalline BaTiO$_3$ formed above 500° C. (see FIG. 10), which is similar to the crystallization behavior found for ALD-grown BaTiO$_3$ on SiO$_2$/Si. Although the MXene film decomposes at 700° C., there is a temperature window of ~200° C., where the MXene film coexists with the crystalline BaTiO$_3$ film permitting the formation of a Ti$_3$C$_2$—BaTiO$_3$ heterostructure.

Example 7. Summary. In summary, BaTiO$_3$ thin films were grown by ALD and PLD on quartz glass and Pt-silicon substrates with seed layers of Ti$_3$C$_2$ MXene flakes acting as degradable template to promote highly oriented growth. The results showed that the high temperature and oxygen rich environment used in the BTO growth caused the MXene layer to fully degrade, but the resultant BTO film had a preferred growth orientation along the (111) direction. This templating effect was independent of the substrate and strongly promoted crystallization on amorphous underlayers. During the growth process, the BTO film was able to adopt the morphology of the initial MXene flakes and preserve it throughout the deposition. The BTO films possessed a cubic lattice parameter that was consistent with the bulk value, suggesting that BTO films can be grown on different substrates without inducing large strains into the film, which would cause dislocation and defect formation. In addition to the highly oriented film, the selection of the MXene lateral flake size provided a high degree of control over the fraction of the film that grew in a specific direction, where larger MXene flakes promoted growth along the (111) direction. TEM images showed columnar grains, and the absence of the initial MXene layer and any other impurities at the bottom interface confirmed that the MXene decomposed during the deposition, where surplus Ti was accommodated in the BTO film and the carbon outgased as COX. PFM and SS-PFM showed that the BTO film grown with the MXene layer retained its ferroelectric behavior and had a robust piezoelectric response. Electrical measurements revealed that the BTO film on MXene coated on Pt-silicon had a comparable dielectric constant and loss tangent to a BTO film grown on bare Pt-silicon. These results showed that a Ti$_3$C$_2$ flakes provided a temporary seed layer that promoted crystallization of unstrained BTO thin films without hindering the electrical or ferroelectric properties. As both, the spray—and dip-coating methods for MXene depositions can be completed cost-effectively on virtually any sized substrate, this approach provides a powerful tool for the growth of highly oriented BTO films on a wide variety of substrates.

As those skilled in the art will appreciate, numerous modifications and variations of the present disclosure are possible in light of these teachings, and all such are contemplated hereby.

The disclosures of each patent, patent application, and publication cited or described in this document are hereby incorporated herein by reference, each in its entirety, for all purposes, or at least for the purpose described in the context in which the reference was presented.

What is claimed:

1. A structure comprising: a stacked assembly of a dielectric substrate, a MXene layer, and at least one layer of an oriented-perovskite-structured material,
   wherein the perovskite-structured material is disposed on the MXene layer,
   wherein the perovskite-structured material has the formula of (i) BaTiO$_3$, (ii) A$_{m-1}$Bi$_2$M$_m$O$_{3m+3}$, (iii) A$_{m+1}$M$_m$O$_{3m+1}$, or (iv) A$_m$M$_m$O$_{3m+2}$,
   wherein when the perovskite-structured material has the formula of A$_{m-1}$Bi$_2$M$_m$O$_{3m+3}$, A=Bi$^{3+}$, Ba$^{2+}$, Sr$^{2+}$, Ca$^{2+}$, Pb$^{2+}$, K$^+$, or Na$^+$, and M=Ti$^{4+}$, Nb$^{5+}$, Ta$^{5-}$, Mo$^{6+}$, W$^{6+}$, or Fe$^{3+}$,
   wherein when the perovskite-structured material has the formula of A$_{m+1}$M$_m$O$_{3m+1}$, A=Bi$^{3+}$, Ba$^{2+}$, Sr$^{2+}$, Ca$^{2+}$, Pb$^{2+}$, K$^+$, or Na$^+$and M=Ti$^{4+}$, Nb$^{5+}$, Ta$^{5-}$, Mo$^{6+}$, W$^{6\ +}$, or Fe$^{3+}$, and
   wherein when the perovskite-structured material has the formula of A$_m$M$_m$O$_{3m+2}$, A=Bi$^{3+}$, Ba$^{2+}$, Sr$^{2+}$, Ca$^{2+}$, Pb$^{2+}$, K$^+$, or Na$^+$, and M=Ti$^{4+}$, Nb$^{5+}$, Ta$^{5-}$, Mo$^{6+}$, W$^{6+}$, or Fe$^{3+}$, and
   wherein the MXene layer is sandwiched between the dielectric substrate and the at least one layer of oriented perovskite-structured material.

2. The structure of claim 1, further comprising a metallic layer, wherein the metallic layer is sandwiched between the dielectric substrate and the MXene layer.

3. A method comprising:
   (a) depositing at least one precursor composition using chemical vapor deposition (CVD), physical vapor deposition
   (PVD), or atomic layer deposition (ALD) onto a film or layer of a MXene composition supported on a substrate to form a layered precursor composition; and
   heat treating or annealing the layered precursor composition to form a layered perovskite structured material;
   (b) depositing at least one perovskite-structured composition using chemical vapor deposition (CVD), physical vapor deposition (PVD), or atomic layer deposition onto a film or layer of a MXene composition supported on a substrate to form a layered composition; and heat treating or
   annealing the layered composition
   to form a layered perovskite-structured material,
   the method resulting in the structure of claim 1.

4. The method of claim 3, further comprising depositing a layer of MXene composition onto the substrate before depositing the at least one precursor composition, or the at least one perovskite-structured composition where the MXene depositing is can spray, spin, or dip coating.

5. The method of claim 3, wherein the depositing is by atomic layer deposition (ALD) or by pulsed layer deposition (PLD).

6. The method of claim 3, wherein the MXene composition comprises:
   (a) at least one layer having first and second surfaces, each layer described by a formula M$_{n+1}$X$_n$T$_x$ and comprising:
   substantially two-dimensional array of crystal cells, each crystal cell having an empirical formula of M$_{n+1}$X$_n$, such that
   each X is positioned within an octahedral array of M, wherein
   M is at least one Group TIM, IVB, VB, or VIB metal or Mn, wherein
   each X is C, N, or a combination thereof;
   n=1, 2, or 3; and wherein
   T$_x$ represents surface termination groups; or
   (b) at least one layer having first and second surfaces, each layer comprising:
   a substantially two-dimensional array of crystal cells,
   each crystal cell having an empirical formula of M'$_2$M''$_n$X$_{n+1}$T$_x$, such that each X is positioned within an octahedral array of M' and M'', and where M''$_n$ are present as individual two-dimensional array of atoms intercalated between a pair of two-dimensional arrays of M' atoms, wherein M' and M" are different Group TIM, IVB, VB, or VIB metals, wherein each X is C, N, or a combination thereof;

n=1 or 2; and wherein $T_x$ represents surface termination groups.

7. The method of claim 6, wherein at least one of said surfaces of each layer has surface termination groups ($T_x$) comprising alkoxide, carboxylate, halide, hydroxide, hydride, oxide, sub-oxide, nitride, sub-nitride, sulfide, thiol, or a combination thereof.

8. The method of claim 6, wherein the crystal cell of the MXene composition has an empirical formula of $Ti_3C_2$.

* * * * *